United States Patent [19]
Eslick et al.

[11] Patent Number: 5,422,855
[45] Date of Patent: Jun. 6, 1995

[54] FLASH MEMORY CARD WITH ALL ZONES CHIP ENABLE CIRCUITRY

[75] Inventors: Russell D. Eslick, Placerville; David M. Brown, Fair Oaks; Lily C. Pao, Orangevale; Brian L. Dipert, Sacramento; Kurt B. Robinson, Newcastle, all of Calif.

[73] Assignee: Intel Corporation, Santa Clara, Calif.

[21] Appl. No.: 316,823

[22] Filed: Sep. 30, 1994

Related U.S. Application Data

[63] Continuation of Ser. No. 861,373, Mar. 31, 1992, abandoned.

[51] Int. Cl.⁶ ............................................. G11C 13/00
[52] U.S. Cl. ..................... 365/226; 365/229; 365/230.03; 365/900
[58] Field of Search .................. 365/230.03, 185, 900, 365/229, 226

[56] References Cited

U.S. PATENT DOCUMENTS

| | | | |
|---|---|---|---|
| 5,185,869 | 2/1993 | Suzuki | 395/375 |
| 5,197,034 | 3/1993 | Fandrich et al. | 365/228 X |
| 5,222,046 | 6/1993 | Kreifels et al. | 365/230.03 |
| 5,224,070 | 6/1993 | Fandrich et al. | 365/185 |
| 5,247,657 | 9/1993 | Myers | 395/550 |
| 5,262,990 | 11/1993 | Mills et al. | 365/189.02 |
| 5,297,148 | 3/1994 | Harari et al. | 371/10.2 |

FOREIGN PATENT DOCUMENTS

0175458A2 3/1986 European Pat. Off. .
0392895A2 10/1990 European Pat. Off. .

OTHER PUBLICATIONS

Examiner's Search Report to the Comptroller of the British Patent Office Dated Dec. 5, 1991.
R. D. Pashley and S. K. Lai, *Flash Memories: The Best of Two Worlds*, IEEE Spectrum, pp. 30–33 (Dec. 1989).
M. A. Levy and D. Elbert, *Solutions for High Density Applications Using Intel Flash Memory* (Oct. 1990), *1991 Memory Products Handbook*, Intel Corporation, pp. 6–297 through 6–344 (1990).
S. Zales, *Flash Memory Outshines ROM and EPROM*, EETimes (May 1990), *1991 Memory Products Handbook*, Intel Corporation, pp. 6–411 through 6–416 (1990).
R. Pashley, *Nonvolatility: Semiconductor vs. Magnetic*, IEEE, International Solid–State Circuits Conference (Feb. 17, 1988), *1991 Memory Products Handbook*, Intel Corporation, pp. 6–393 and 6–394 (1990).
M. Levy, *Flash Memory Operates 10–20 Times Longer*, Computer Technology Review (Aug. 1990), *1991 Memory Products Handbook*, Intel Corporation, pp. 6–417 and 6–418 (1990).
D. Lammers, *PC Standard in the Cards*, EETimes (May 1990), *1991 Memory Products Handbook*, Intel Corporation, pp. 6–406 through 6–410 (1990).
*Memory Breakthrough Drives Minaturization*, Portable Computing (Oct. 1990) *1991 Memory Products Handbook*, Intel Corporation, pp. 6–419 and 6–420 (1990).
S. Baker, *Silicon Bits, The Memory Driver, 1991 Memory Products Handbook*, Intel Corporation, p. 6–399 (1990).
D. Verner, *Designing an Updatable BIOS Using Flash Memory, 1991 Memory Handbook*, Intel Corporation, pp. 6–248 through 6–296 (Oct. 1990).
Data Sheets for the iMC001FLKA and the iMC004F-LKA, *1991 Memory Products Handbook*, Intel Corporation, pp. 6–143 through 6–202 (Oct. 1990).
C. Townsend, *Advanced MS–DOS Expert Techniques for Programmers*, pp. 1–63 (Howard W. Sams & Company 1989).
*PC Card Standard*, Release 1.0, Personal Computer Memory Card International Association, pp. 1–102 (Nov. 1990).
*PC Card Standard*, Release 2.0, Personal Computer Memory Card International Association, pp. 1–1 through 6–38 (Sep. 1991).
D. A. Patterson, J. L. Hennessy, and D. Goldberg, *Computer Architecture a Quantitative Approach*, Morgan Kaufmann Publishers, Inc., p. 519 (1990).

*Primary Examiner*—Do Hyun Yoo
*Attorney, Agent, or Firm*—Blakely, Sokoloff, Taylor & Zafman

[57] ABSTRACT

A flash memory card is described. One flash memory card has addressable circuitry for selectively causing first, second, and third flash memories to operate in an active mode concurrently.

3 Claims, 33 Drawing Sheets

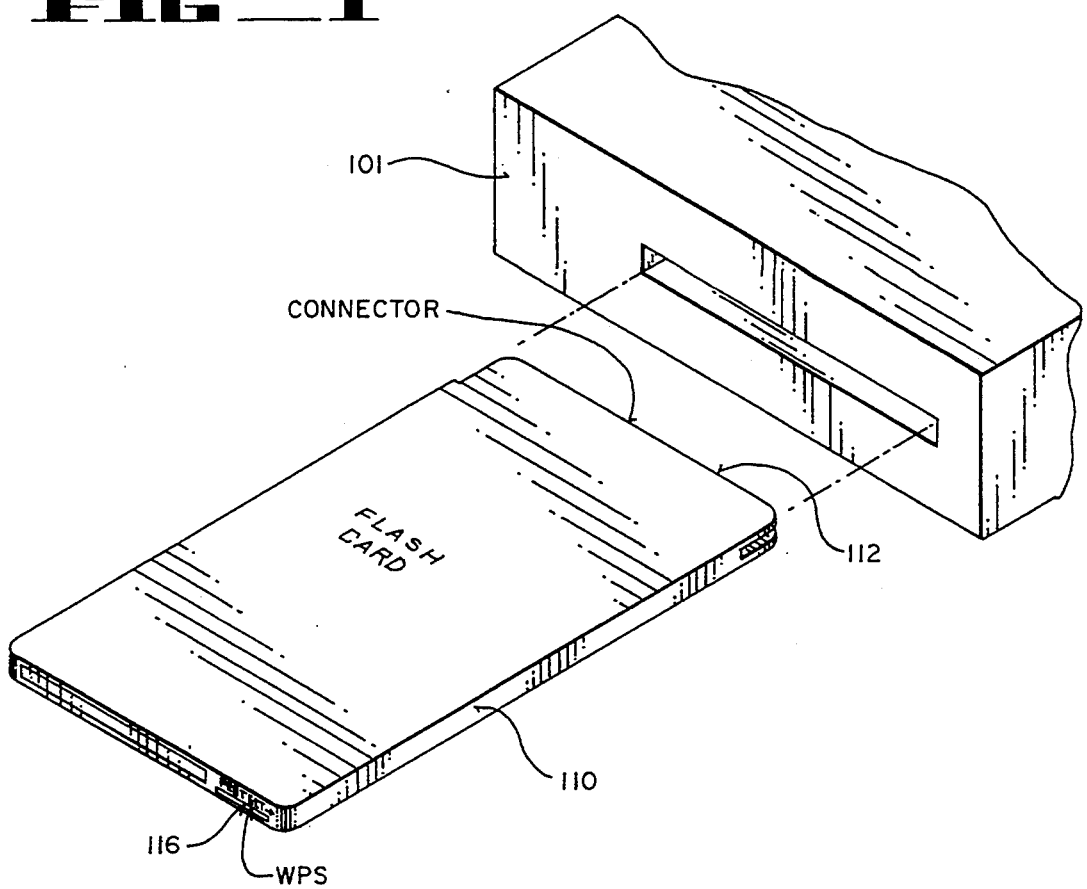
FIG_1
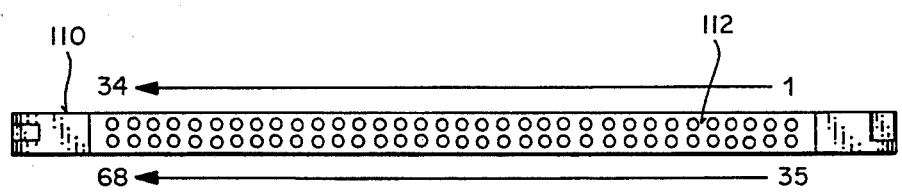
FIG_2

FIG_3

| PIN | SIGNAL | I/O | FUNCTION | ACTIVE | PIN | SIGNAL | I/O | FUNCTION | ACTIVE |
|---|---|---|---|---|---|---|---|---|---|
| 1 | GND | | GROUND | | 35 | GND | | GROUND | |
| 2 | DQ3 | I/O | DATA BIT 3 | | 36 | CD1# | O | CARD DETECT 1 | LOW |
| 3 | DQ4 | I/O | DATA BIT 4 | | 37 | DQ11 | I/O | DATA BIT 11 | |
| 4 | DQ5 | I/O | DATA BIT 5 | | 38 | DQ12 | I/O | DATA BIT 12 | |
| 5 | DQ6 | I/O | DATA BIT 6 | | 39 | DQ13 | I/O | DATA BIT 13 | |
| 6 | DQ7 | I/O | DATA BIT 7 | | 40 | DQ14 | I/O | DATA BIT 14 | |
| 7 | CE1# | I | CARD ENABLE 1 | LOW | 41 | DQ15 | I/O | DATA BIT 15 | |
| 8 | A10 | I | ADDRESS BIT 10 | | 42 | CE2# | I | CARD ENABLE 2 | LOW |
| 9 | OE# | I | OUTPUT ENABLE | LOW | 43 | N/C | | NO CONNECTION | |
| 10 | A11 | I | ADDRESS BIT 11 | | 44 | RFU | | RESERVED | |
| 11 | A9 | I | ADDRESS BIT 9 | | 45 | RFU | | RESERVED | |
| 12 | A8 | I | ADDRESS BIT 8 | | 46 | A17 | I | ADDRESS BIT 17 | |
| 13 | A13 | I | ADDRESS BIT 13 | | 47 | A18 | I | ADDRESS BIT 18 | |
| 14 | A14 | I | ADDRESS BIT 14 | | 48 | A19 | I | ADDRESS BIT 19 | |
| 15 | WE# | I | WRITE ENABLE | LOW | 49 | A20 | I | ADDRESS BIT 20 | |
| 16 | RDY/BSY# | O | READY/BUSY | LOW | 50 | A21 | I | ADDRESS BIT 21 | |
| 17 | VCC | | SUPPLY VOLTAGE | | 51 | VCC | | SUPPLY VOLTAGE | |
| 18 | VPP1 | | PROGRAMMING SUPPLY | | 52 | VPP2 | | PROGRAMMING SUPPLY | |
| 19 | A16 | I | ADDRESS BIT 16 | | 53 | A22 | I | ADDRESS BIT 22 | |
| 20 | A15 | I | ADDRESS BIT 15 | | 54 | A23 | I | ADDRESS BIT 23 | |
| 21 | A12 | I | ADDRESS BIT 12 | | 55 | A24 | I | ADDRESS BIT 24 | |
| 22 | A7 | I | ADDRESS BIT 7 | | 56 | N/C | | NO CONNECTION | |
| 23 | A6 | I | ADDRESS BIT 6 | | 57 | RFU | | RESERVED | |
| 24 | A5 | I | ADDRESS BIT 5 | | 58 | RST | I | RESET | HIGH |
| 25 | A4 | I | ADDRESS BIT 4 | | 59 | WAIT# | O | EXTEND BUS CYCLE | LOW |
| 26 | A3 | I | ADDRESS BIT 3 | | 60 | RFU | | RESERVED | |
| 27 | A2 | I | ADDRESS BIT 2 | | 61 | REG# | I | REGISTER SELECT | LOW |
| 28 | A1 | I | ADDRESS BIT 1 | | 62 | BVD2# | O | BATT. VOLT DET 2 | |
| 29 | A0 | I | ADDRESS BIT 0 | | 63 | BVD1# | O | BATT. VOLT DET 1 | |
| 30 | DQ0 | I/O | DATA BIT 0 | | 64 | DQ8 | I/O | DATA BIT 8 | |
| 31 | DQ1 | I/O | DATA BIT 1 | | 65 | DQ9 | I/O | DATA BIT 9 | |
| 32 | DQ2 | I/O | DATA BIT 2 | | 66 | DQ10 | I/O | DATA BIT 10 | |
| 33 | WP | O | WRITE PROTECT | HIGH | 67 | CD2# | O | CARD DETECT 2 | LOW |
| 34 | GND | | GROUND | | 68 | GND | | GROUND | |

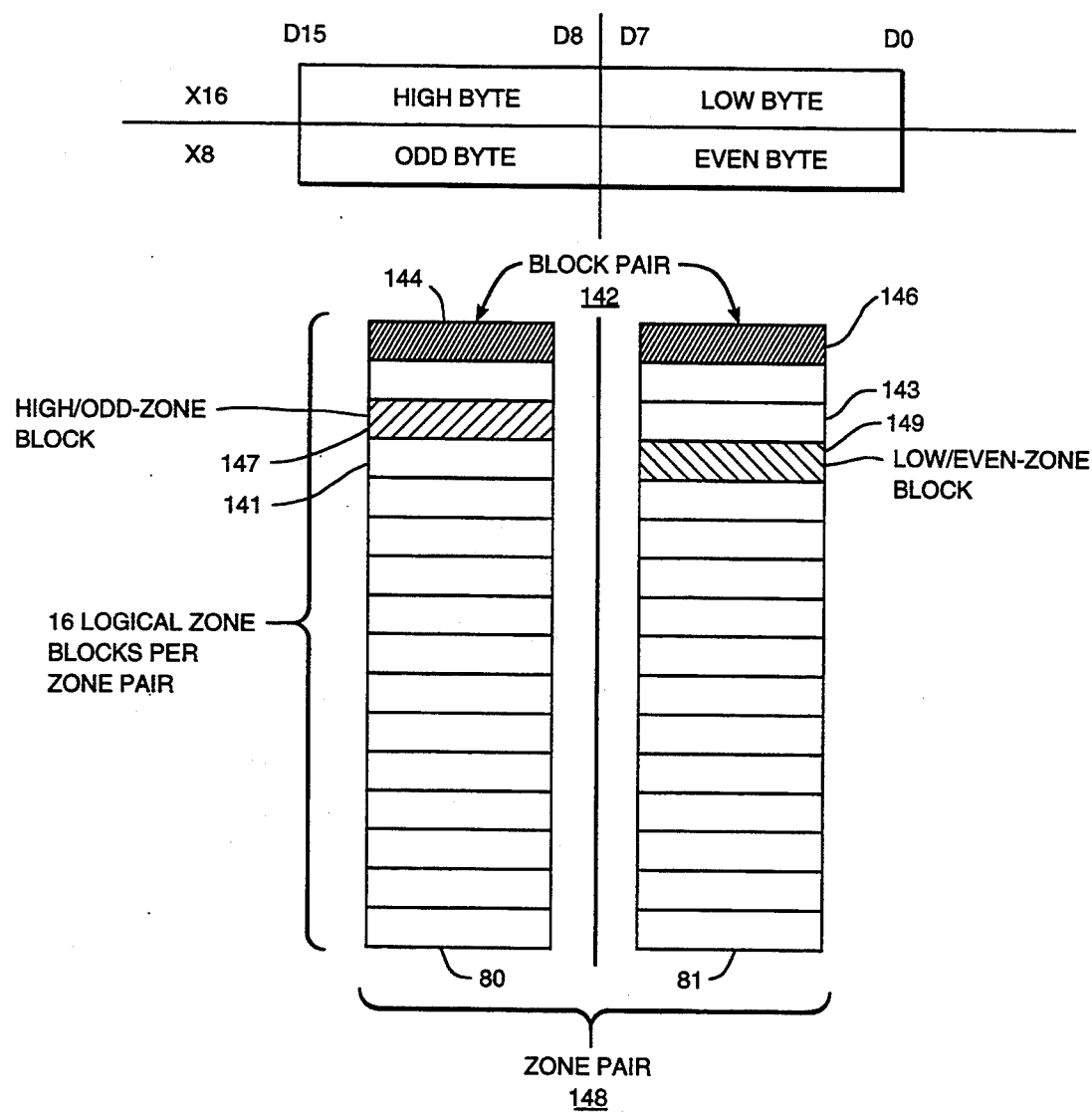

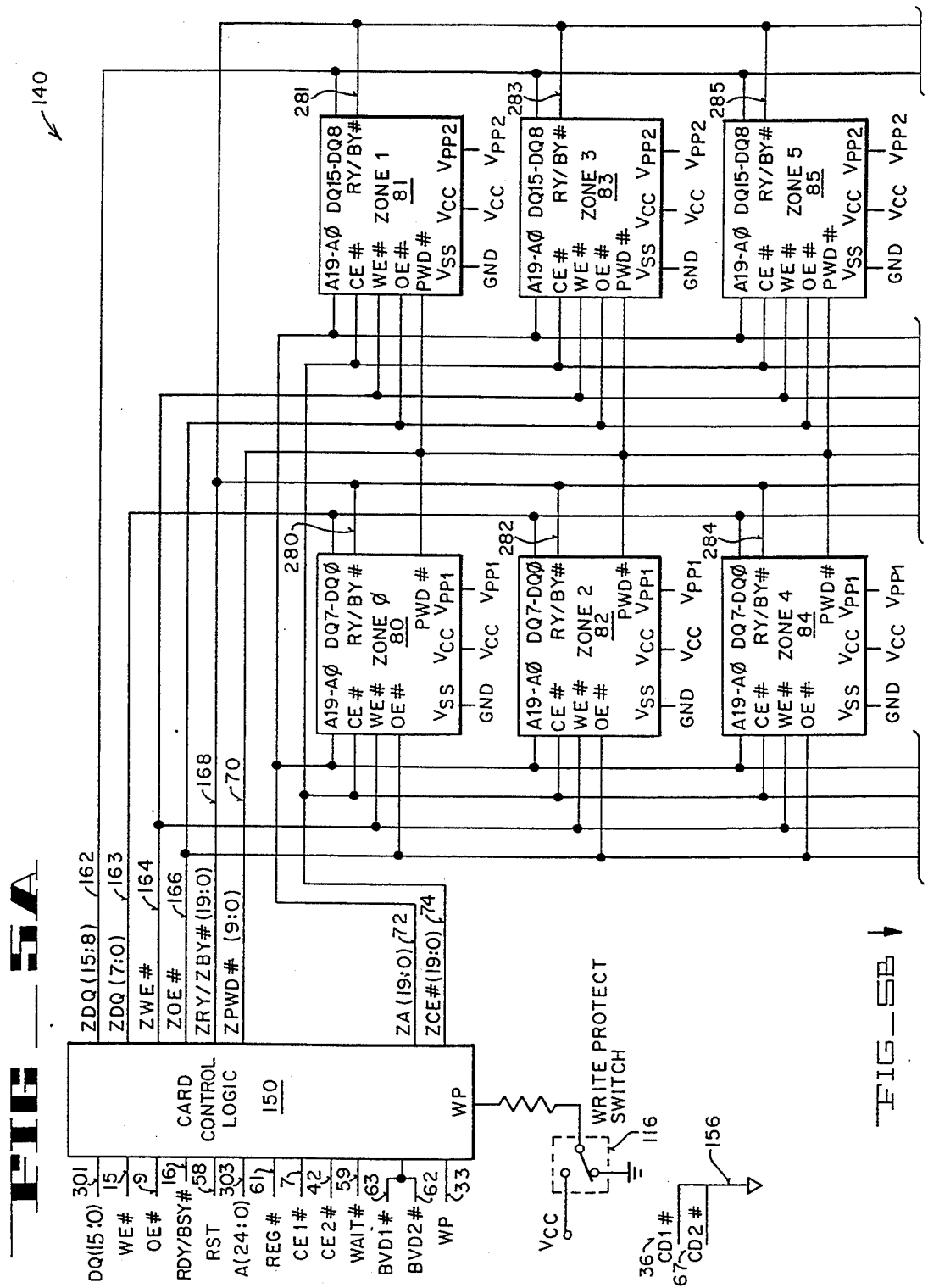

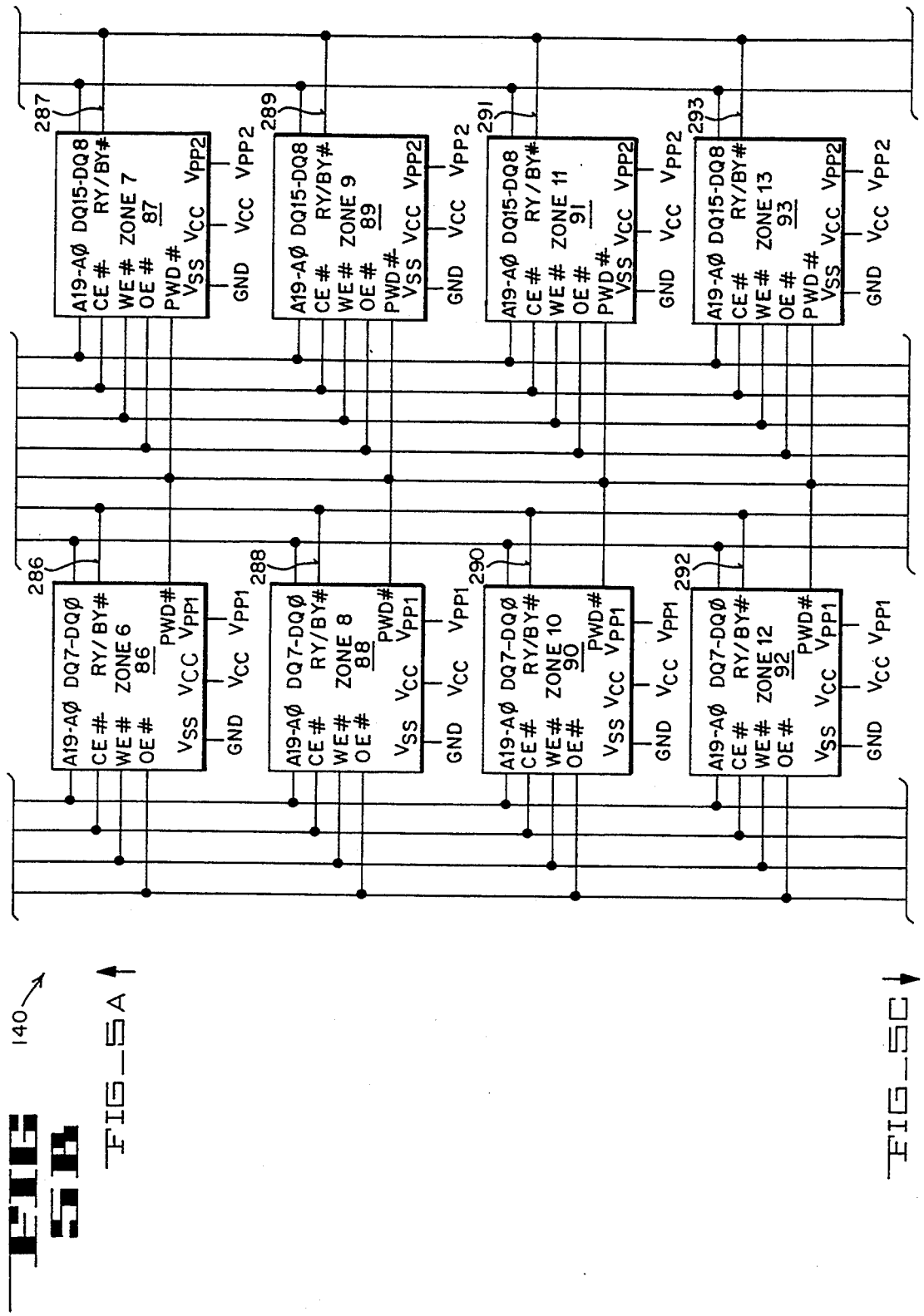

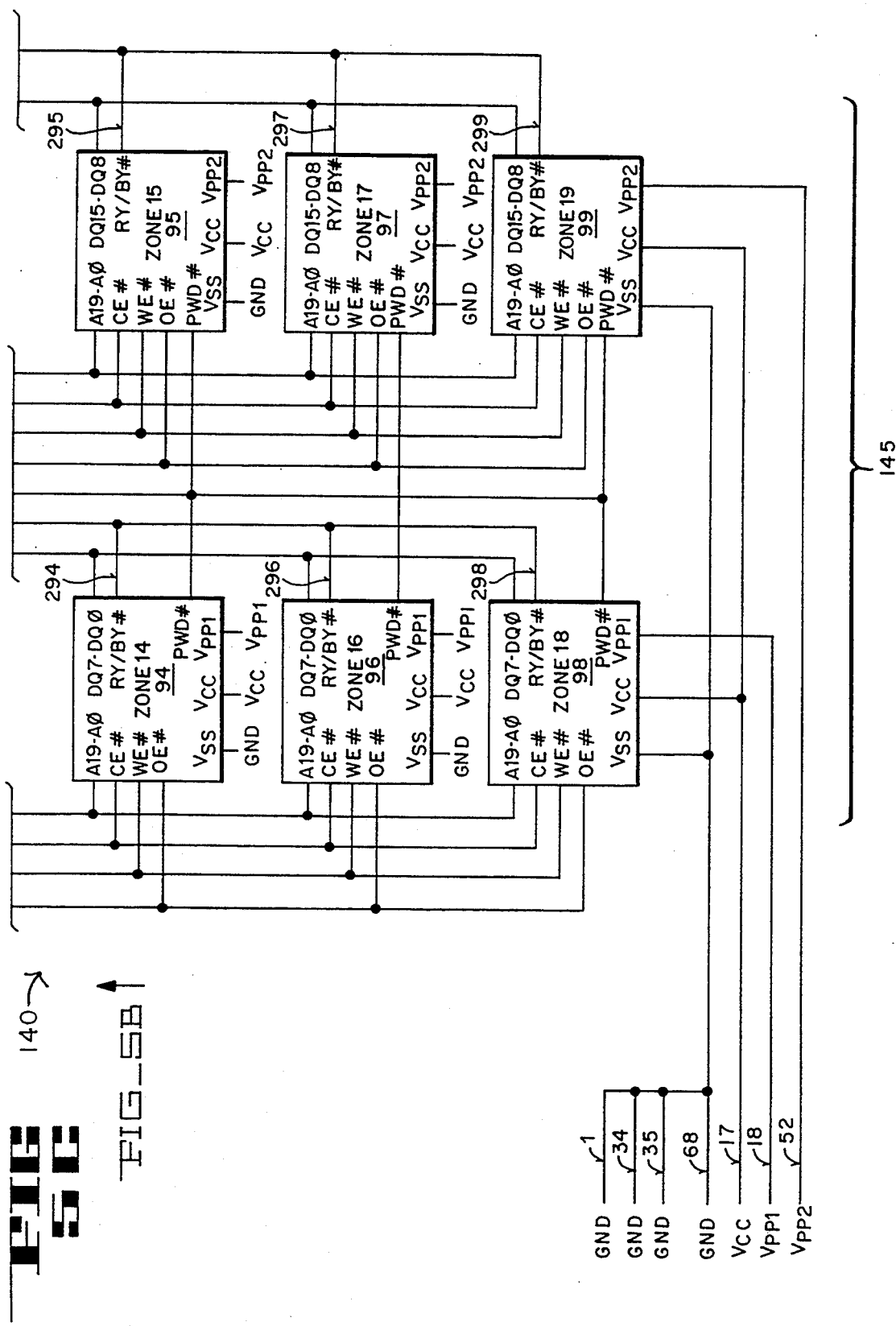

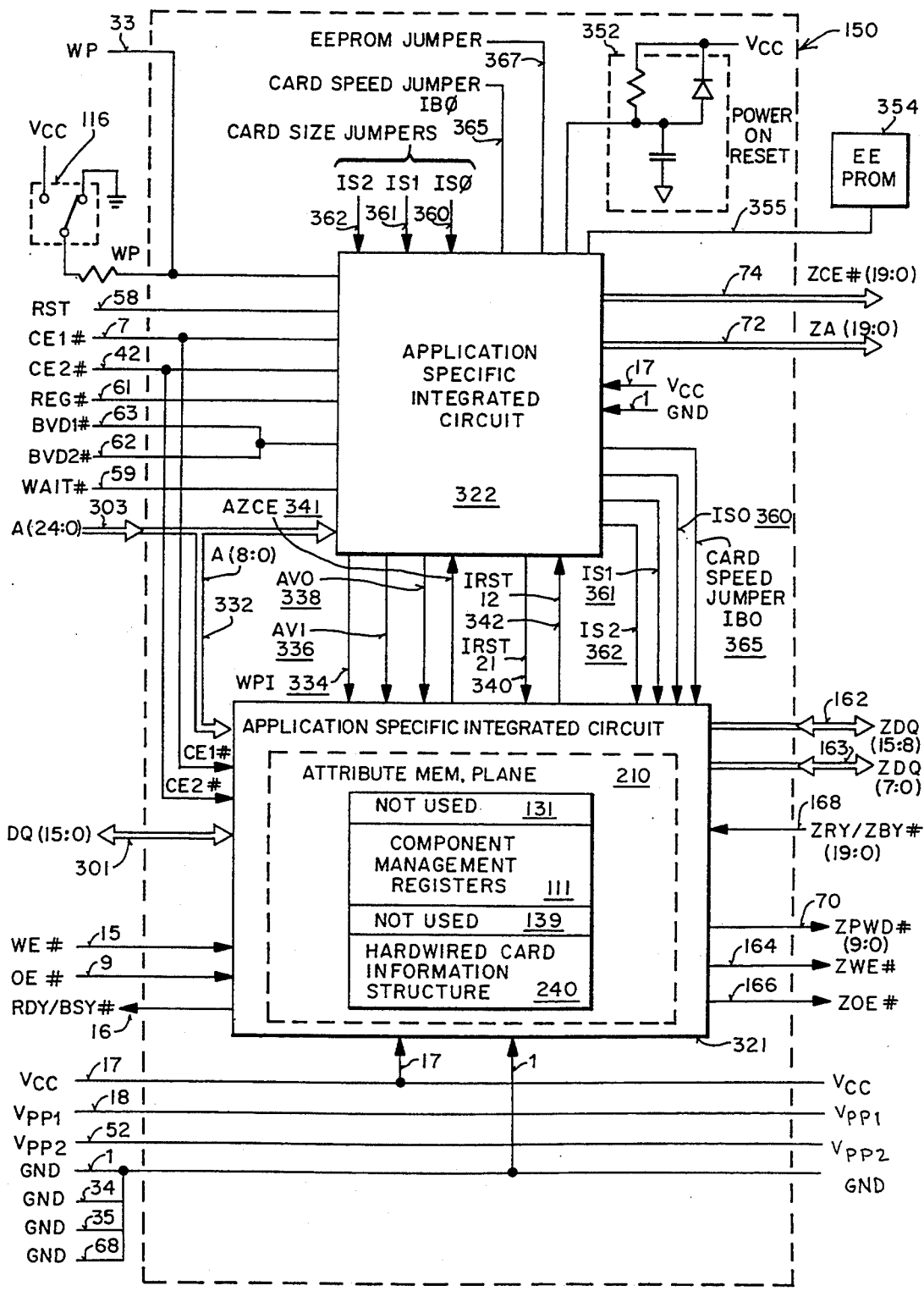

FIG_7

| ADDRESS RANGE | FUNCTION | |
|---|---|---|
| 4200 HEX TO 42FE HEX | RESERVED | 468 |
| 41FC HEX TO 41FE HEX | ALL ZONES CE # | 467 |
| 4142 HEX TO 41FA HEX | RESERVED | 466 |
| 4140 HEX | RDY/BSY# MODE | 465 |
| 4136 HEX TO 4138 HEX | RESERVED | 464 |
| 4130 HEX TO 4134 HEX | ZRY/ZBY# STATUS | 463 |
| 4126 HEX | RESERVED | 462 |
| 4122 HEX TO 4126 HEX | ZRY/ZBY# MASK | 461 |
| 411C HEX TO 4120 HEX | RESERVED | 460 |
| 4118 HEX TO 411A HEX | POWER CONTROL | 459 |
| 4106 HEX TO 4116 HEX | RESERVED | 458 |
| 4104 HEX | WRITE PROTECTION | 457 |
| 4102 HEX | RESERVED | 456 |
| 4100 HEX | CARD STATUS | 455 |
| 4008 HEX TO 40FE HEX | RESERVED | 454 |
| 4006 HEX | SOCKET AND COPY | 453 |
| 4004 HEX | PIN REPLACEMENT | 452 |
| 4002 HEX | CONFIGURATION AND STATUS | 451 |
| 4000 HEX | CONFIGURATION OPTION | 450 |

ATTRIBUTE MEMORY PLANE: 432

ADDRESS

| NOT USED 131 | 0004000 HEX |
| COMPONENT MANAGEMENT REGISTERS 111 | |
| NOT USED 139 | |
| HARDWIRED CIS | 0000 0000 HEX |

240

COMPONENT MANAGEMENT REGISTERS 430

DATA ACCESS MODE TRUTH TABLE 500

| FUNCTION MODE | REG# | CE2# | CE1# | A0 | OE# | WE# | VPP2 | VPP1 | DQ15-DQ8 | DQ7-DQ0 |
|---|---|---|---|---|---|---|---|---|---|---|
| | | | | | | | | | FOR A WRITE: WP=LOW; CMWP=ATPWP=0 | |
| COMMON MEMORY PLANE 510 | | | | | | | | | | |
| STANDBY | X | H | H | X | X | X | VPPL | VPPL | HIGH-Z | HIGH-Z |
| BYTE READ | H | H | L | L | L | H | VPPL | VPPL | HIGH-Z | EVEN-BYTE |
| | H | H | L | H | L | H | VPPL | VPPL | HIGH-Z | ODD-BYTE |
| WORD READ | H | L | L | X | L | H | VPPL | VPPL | ODD-BYTE | EVEN-BYTE |
| ODD-BYTE READ | H | L | H | X | L | H | VPPL | VPPL | ODD-BYTE | HIGH-Z |
| BYTE WRITE | H | H | L | L | H | L | VPPH | VPPH | X | EVEN-BYTE |
| | H | H | L | H | H | L | VPPH | VPPH | X | ODD-BYTE |
| WORD WRITE | H | L | L | X | H | L | VPPH | VPPH | ODD-BYTE | EVEN-BYTE |
| ODD-BYTE WRITE | H | L | H | X | H | L | VPPH | VPPL | ODD-BYTE | X |
| ATTRIBUTE MEMORY PLANE 512 | | | | | | | | | FOR A WRITE: WP=LOW | |
| BYTE-READ | L | H | L | L | L | H | X | X | HIGH-Z | EVEN-BYTE |
| | L | H | L | H | L | H | X | X | HIGH-Z | INVALID |
| WORD READ | L | L | L | X | L | H | X | X | INVALID DATA | EVEN-BYTE |
| ODD-BYTE READ | L | L | H | X | L | H | X | X | INVALID DATA | HIGH-Z |
| BYTE WRITE | L | H | L | L | H | L | X | X | X | EVEN-BYTE |
| | L | H | L | H | H | L | X | X | X | INVALID OPERATION |
| WORD WRITE | L | L | L | X | H | L | X | X | INVALID OPERATION | EVEN-BYTE |
| ODD-BYTE WRITE | L | L | H | X | H | L | X | X | INVALID OPERATION | X |

FIG_9

| ADDRESS | BIT 7 | BIT 6 | BIT 5 | BIT 4 | BIT 3 | BIT 2 | BIT 1 | BIT 0 |
|---|---|---|---|---|---|---|---|---|
| 4126 H | ← RESERVED → | | | | ZONE 19 | ZONE 18 | ZONE 17 | ZONE 16 |
| 4124 H | ZONE 15 | ZONE 14 | ZONE 13 | ZONE 12 | ZONE 11 | ZONE 10 | ZONE 9 | ZONE 8 |
| 4122 H | ZONE 7 | ZONE 6 | ZONE 5 | ZONE 4 | ZONE 3 | ZONE 2 | ZONE 1 | ZONE 0 |

600

FIG_10

| ADDRESS | BIT 7 | BIT 6 | BIT 5 | BIT 4 | BIT 3 | BIT 2 | BIT 1 | BIT 0 |
|---|---|---|---|---|---|---|---|---|
| 4140 HEX | //////// ZEROES //////// | | | | | | RM01 | RM00 |

650

FIG_11

| ADDRESS | BIT 7 | BIT 6 | BIT 5 | BIT 4 | BIT 3 | BIT 2 | BIT 1 | BIT 0 |
|---|---|---|---|---|---|---|---|---|
| 4134 H | ← RESERVED → | | | | ZONE 19 | ZONE 18 | ZONE 17 | ZONE 16 |
| 4132 H | ZONE 15 | ZONE 14 | ZONE 13 | ZONE 12 | ZONE 11 | ZONE 10 | ZONE 9 | ZONE 8 |
| 4130 H | ZONE 7 | ZONE 6 | ZONE 5 | ZONE 4 | ZONE 3 | ZONE 2 | ZONE 1 | ZONE 0 |

675

FIG_12

| ADDRESS | BIT 7 | BIT 6 | BIT 5 | BIT 4 | BIT 3 | BIT 2 | BIT 1 | BIT 0 |
|---|---|---|---|---|---|---|---|---|
| 411A HEX | //////// | | | | | | ZONE 18/19 | ZONE 16/17 |
| 4118 HEX | ZONE 14/15 | ZONE 12/13 | ZONE 10/11 | ZONE 8/9 | ZONE 6/7 | ZONE 4/5 | ZONE 2/3 | ZONE 0/1 |

| ADDRESS | BIT 7 | BIT 6 | BIT 5 | BIT 4 | BIT 3 | BIT 2 | BIT 1 | BIT 0 |
|---------|-------|-------|-------|-------|-------|-------|-------|-------|
| 4002H | ZEROES | | | | | PWR-DOWN | ZEROES | |

| ADDRESS | BIT 7 | BIT 6 | BIT 5 | BIT 4 | BIT 3 | BIT 2 | BIT 1 | BIT 0 |
|---------|-------|-------|-------|-------|-------|-------|-------|-------|
| 4104 H | RESERVED FOR FUTURE USE | | | | | | CMWP | ATRWP |

| ADDRESS | BIT 7 | BIT 6 | BIT 5 | BIT 4 | BIT 3 | BIT 2 | BIT 1 | BIT 0 |
|---------|-------|-------|-------|-------|-------|-------|-------|-------|
| 4000H | SRESET | WRITE ZEROES | | | | | | |

| ADDRESS | BIT 7 | BIT 6 | BIT 5 | BIT 4 | BIT 3 | BIT 2 | BIT 1 | BIT 0 |
|---------|-------|-------|-------|-------|-------|-------|-------|-------|
| 4100H | ANYZ-MSK | ANYZ-PWD | SRESET | CMWP | PWR-DWN | ATRWP | WP | RDY/BSY# |

800

FIG_17
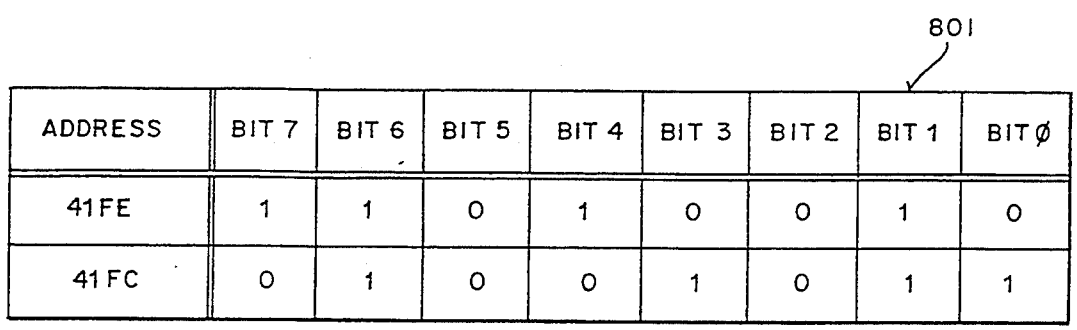
| ADDRESS | BIT 7 | BIT 6 | BIT 5 | BIT 4 | BIT 3 | BIT 2 | BIT 1 | BIT 0 |
|---|---|---|---|---|---|---|---|---|
| 41FE | 1 | 1 | 0 | 1 | 0 | 0 | 1 | 0 |
| 41FC | 0 | 1 | 0 | 0 | 1 | 0 | 1 | 1 |

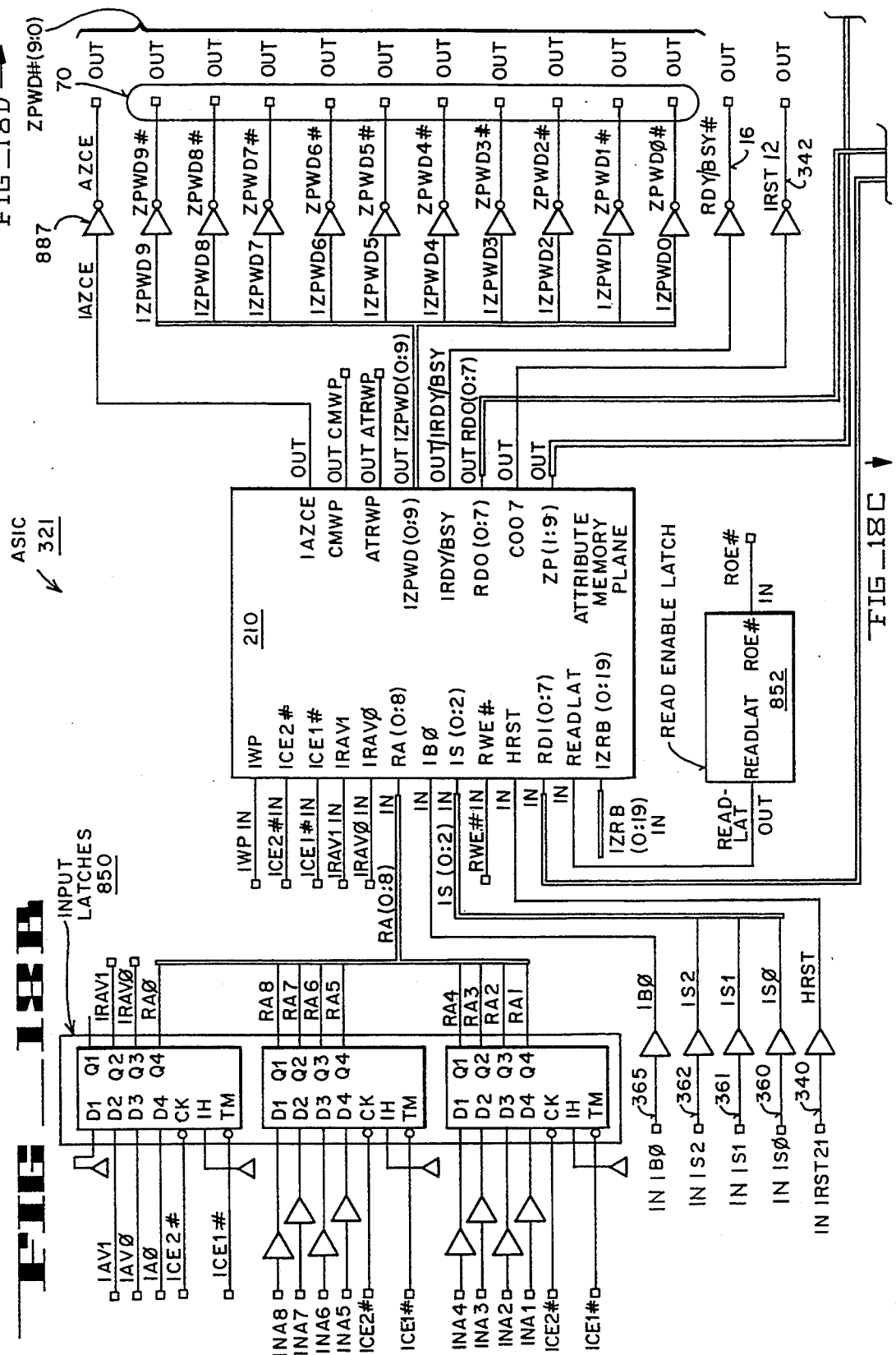

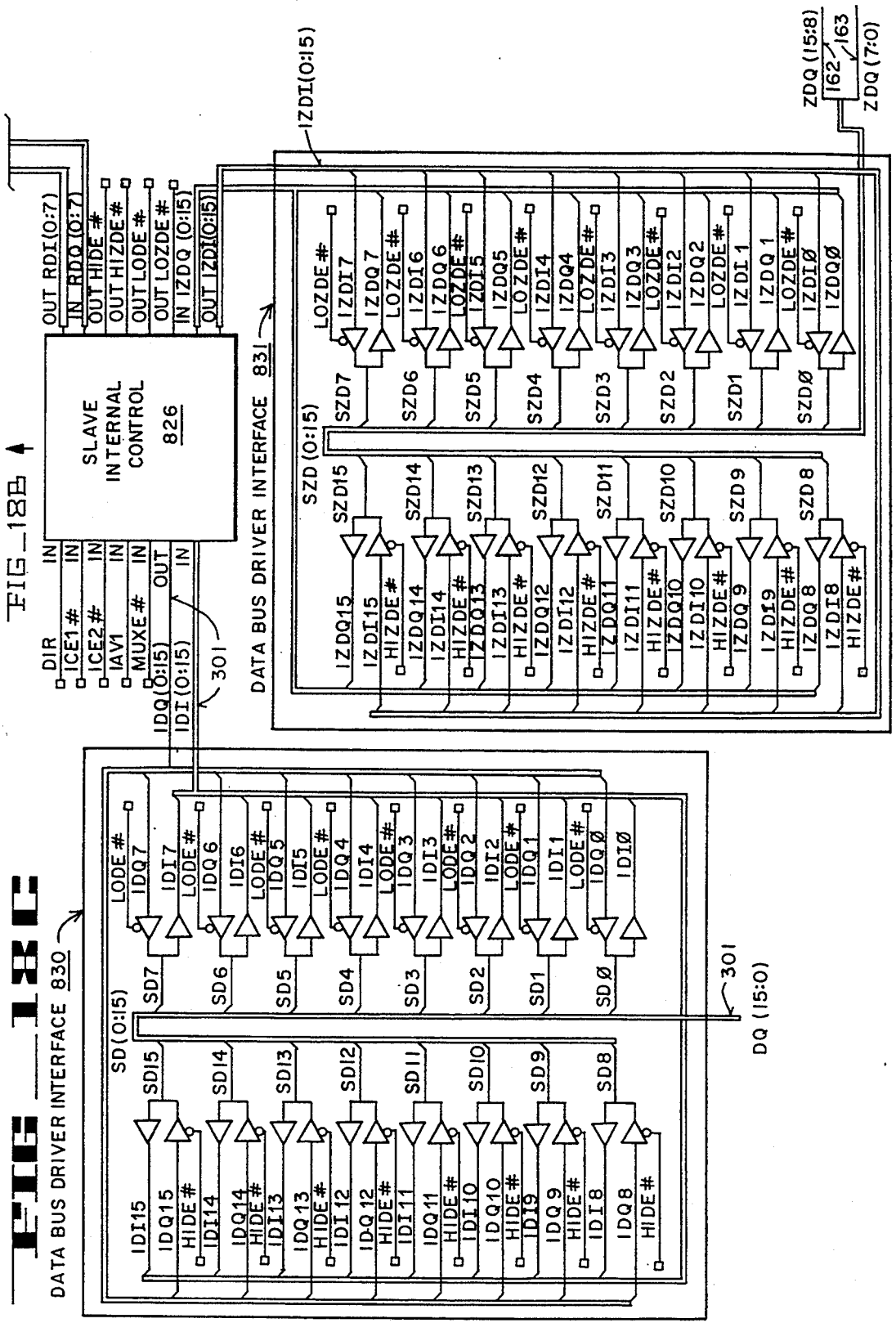

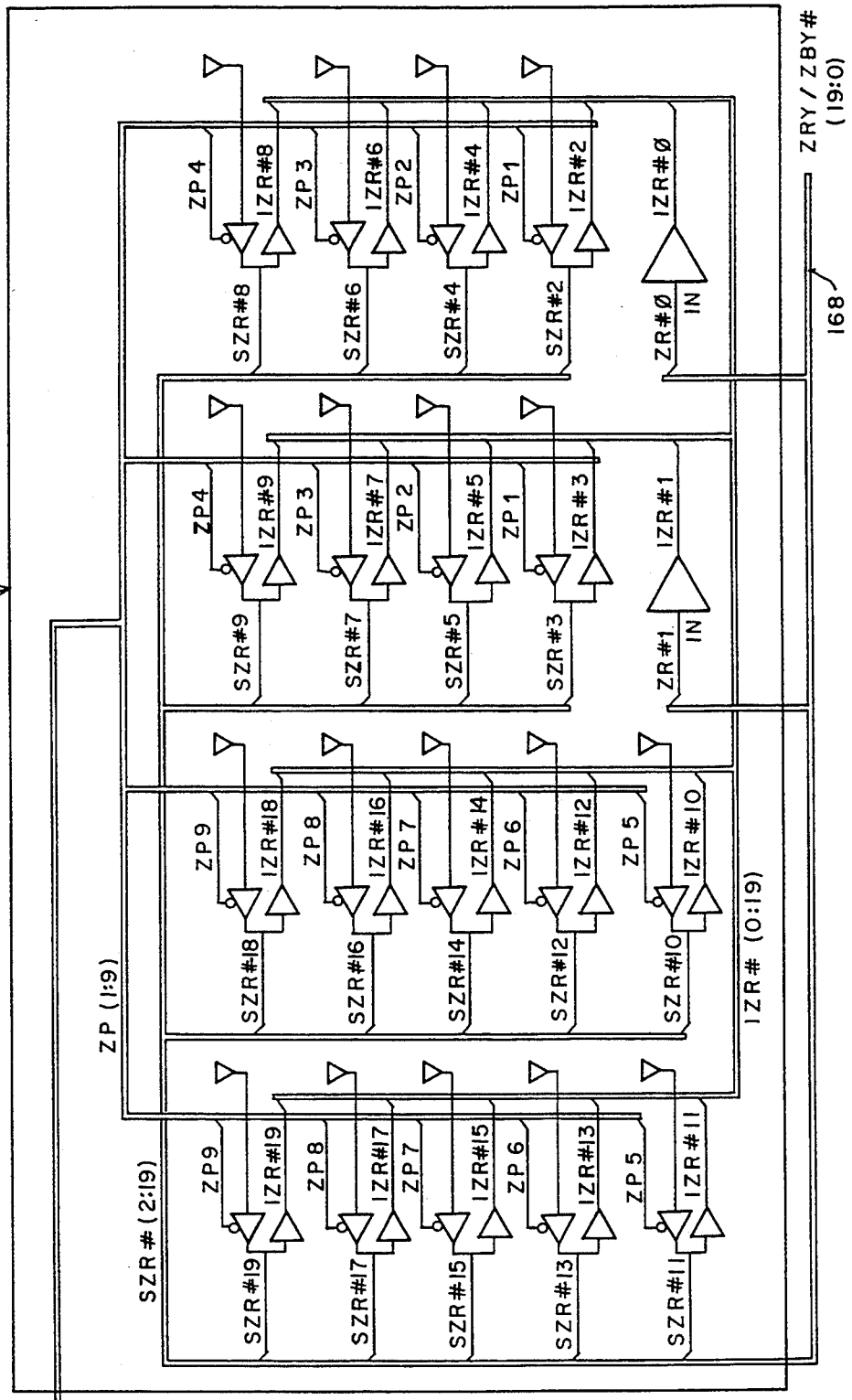
FIG_18D

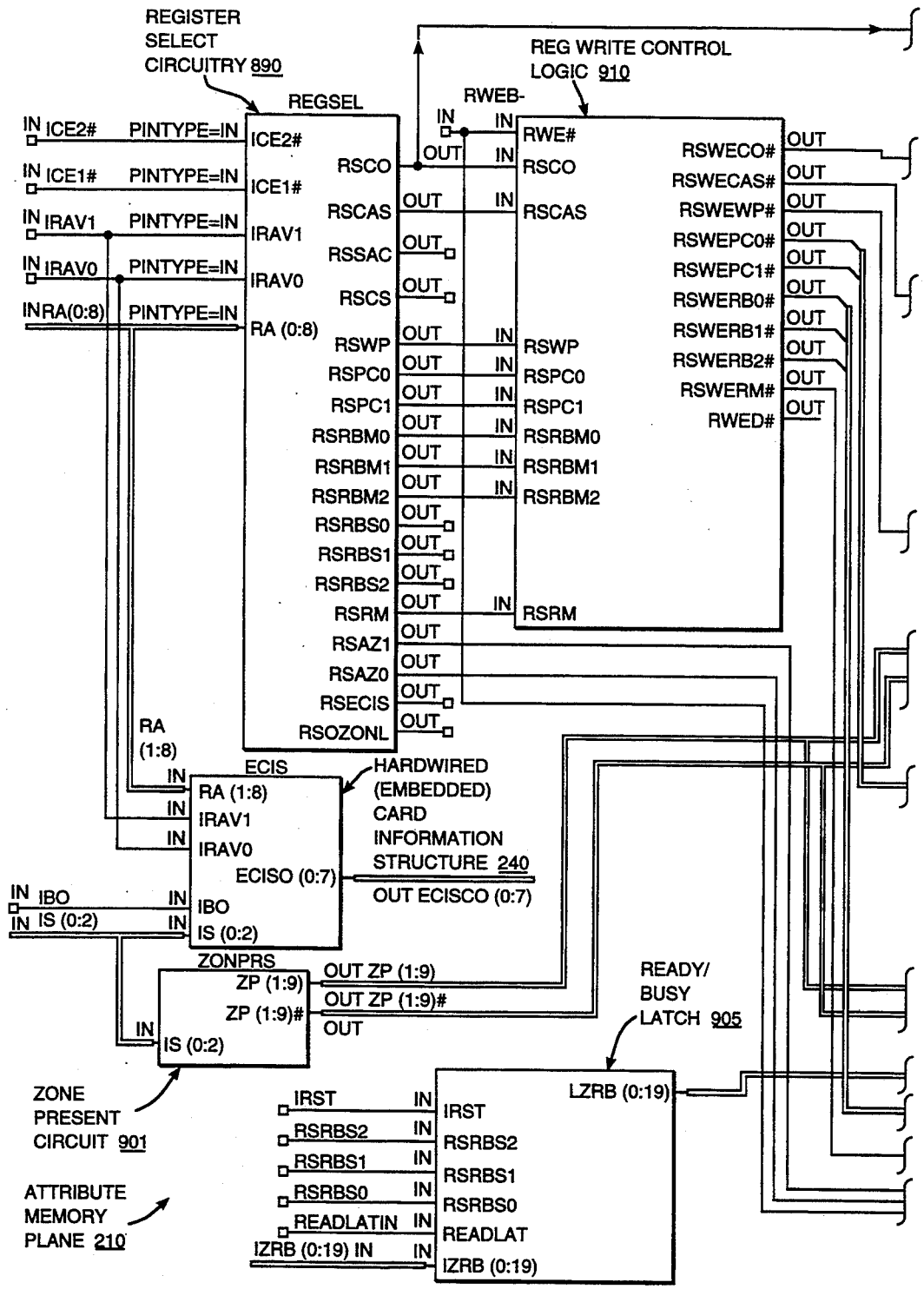

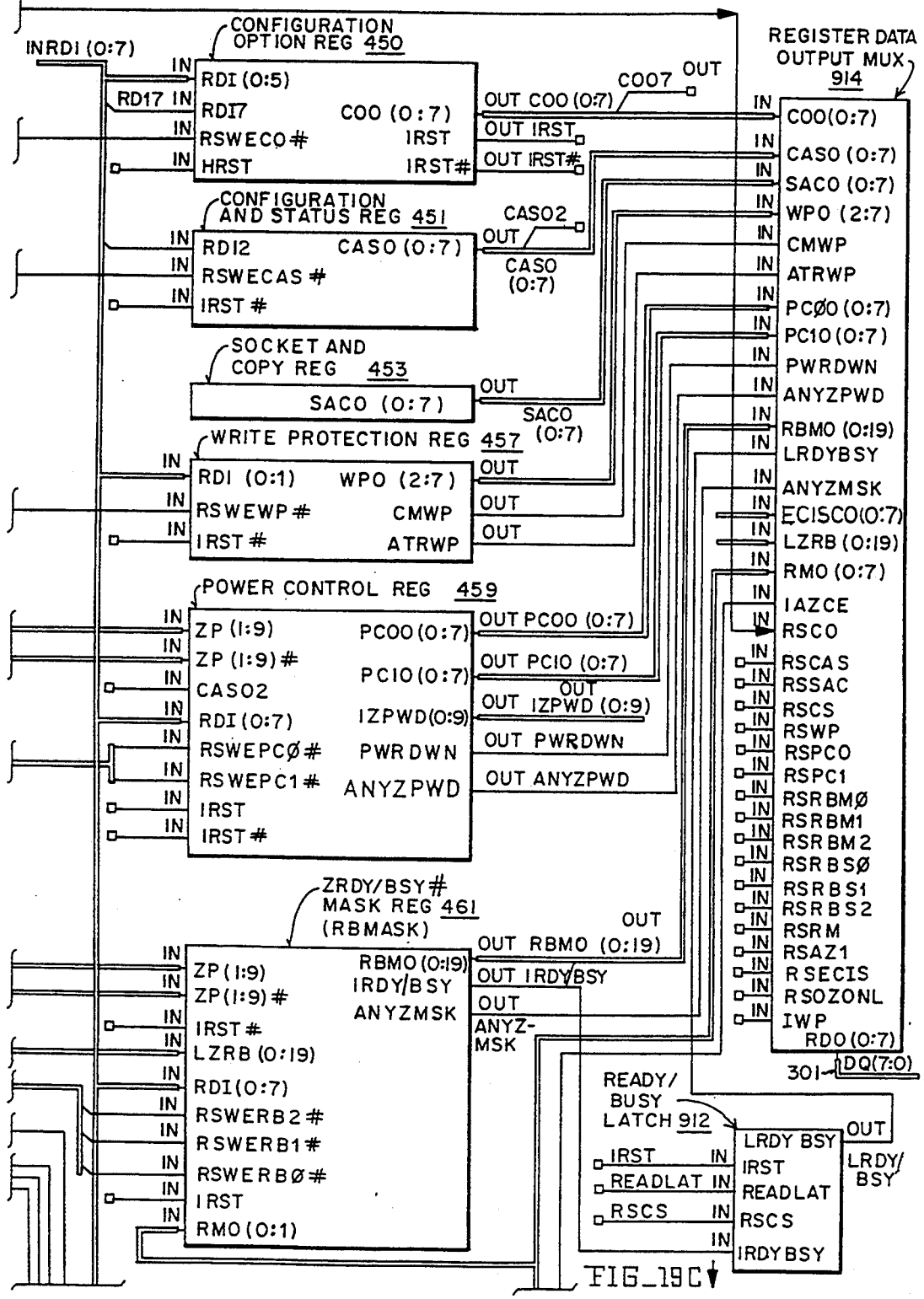

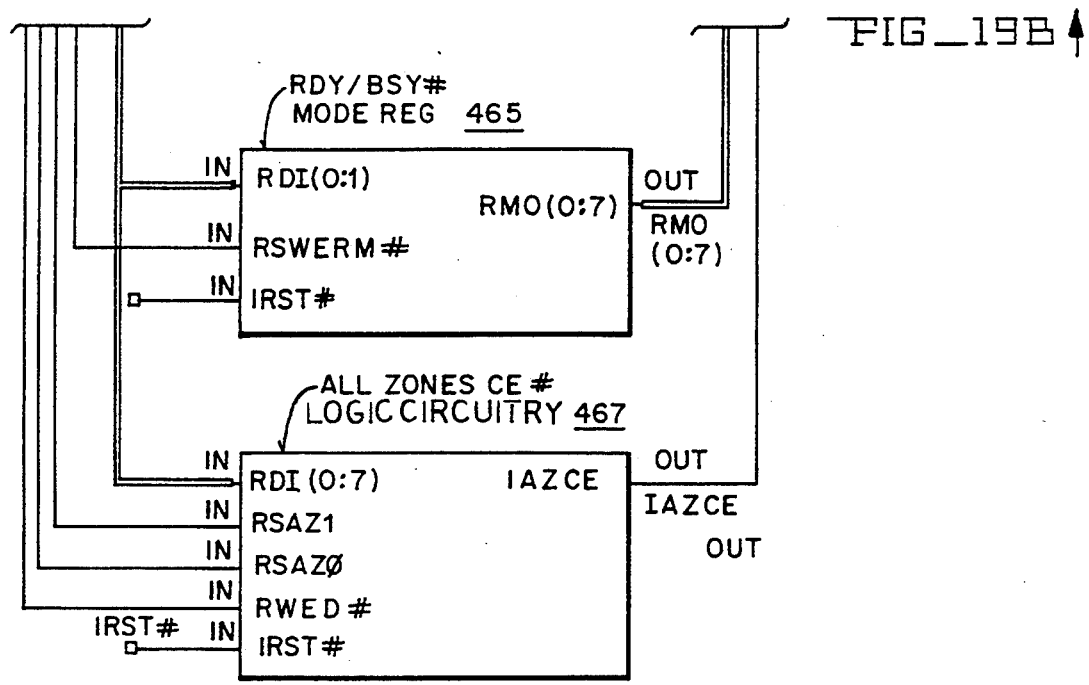
FIG_19C

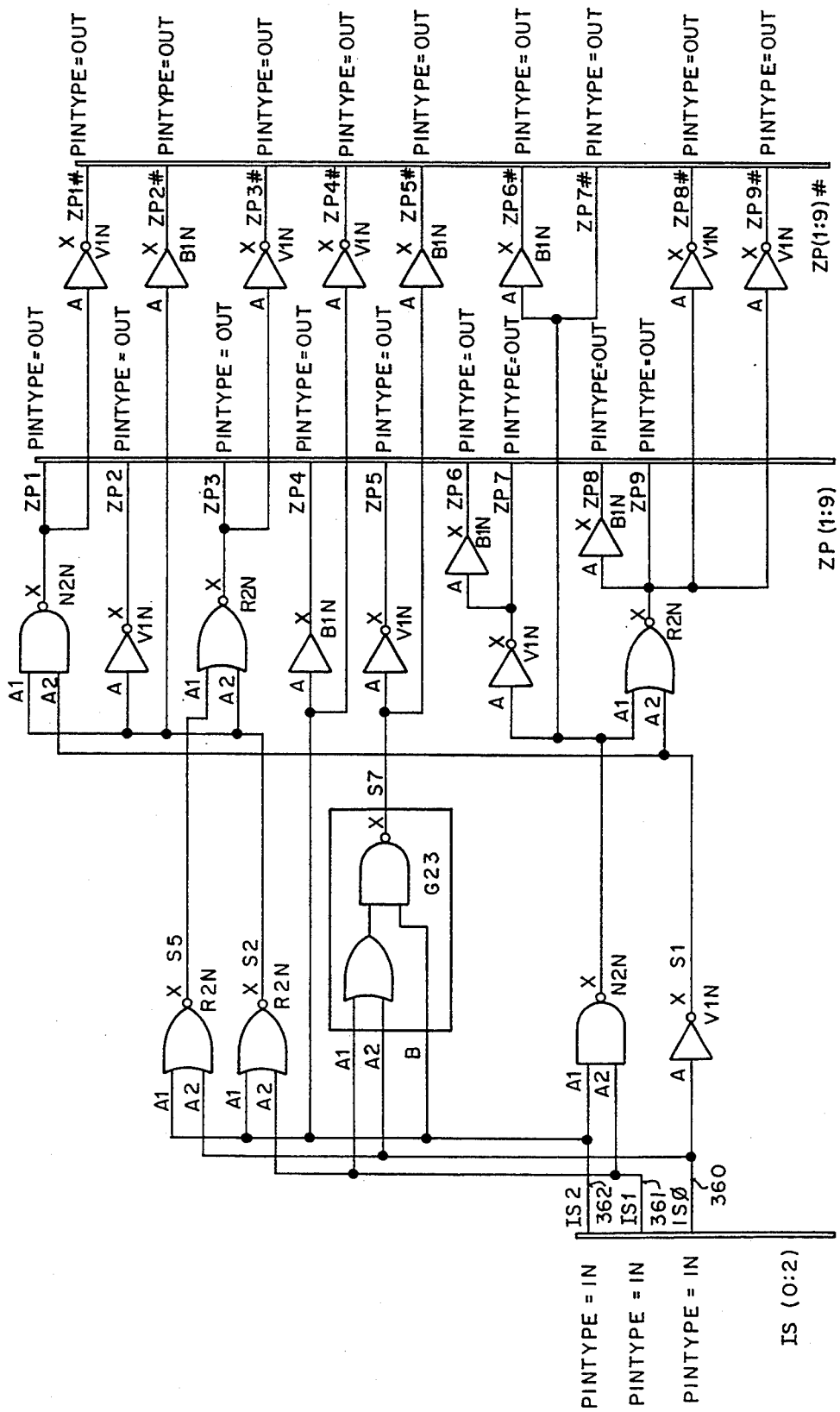
FIG_20

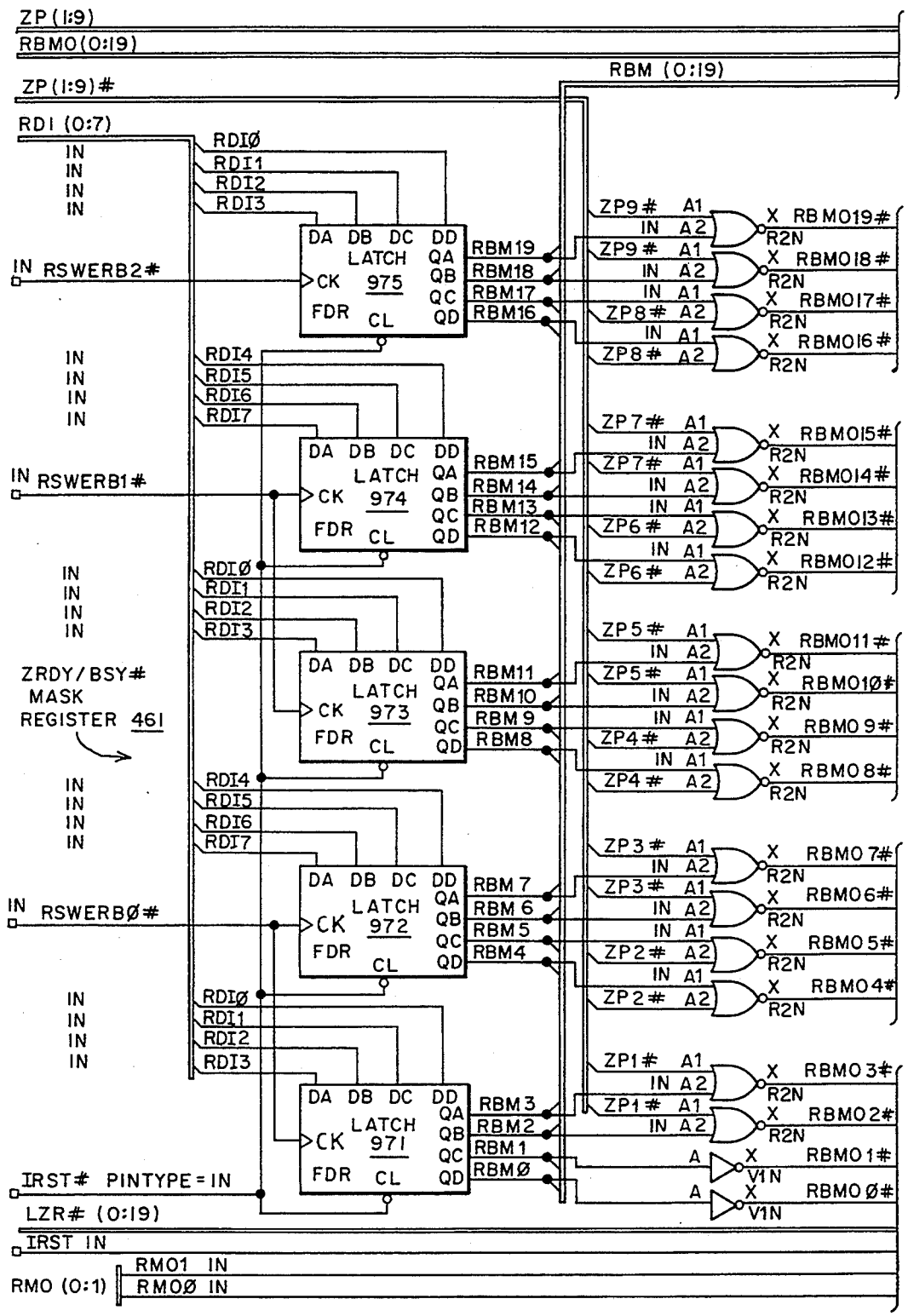

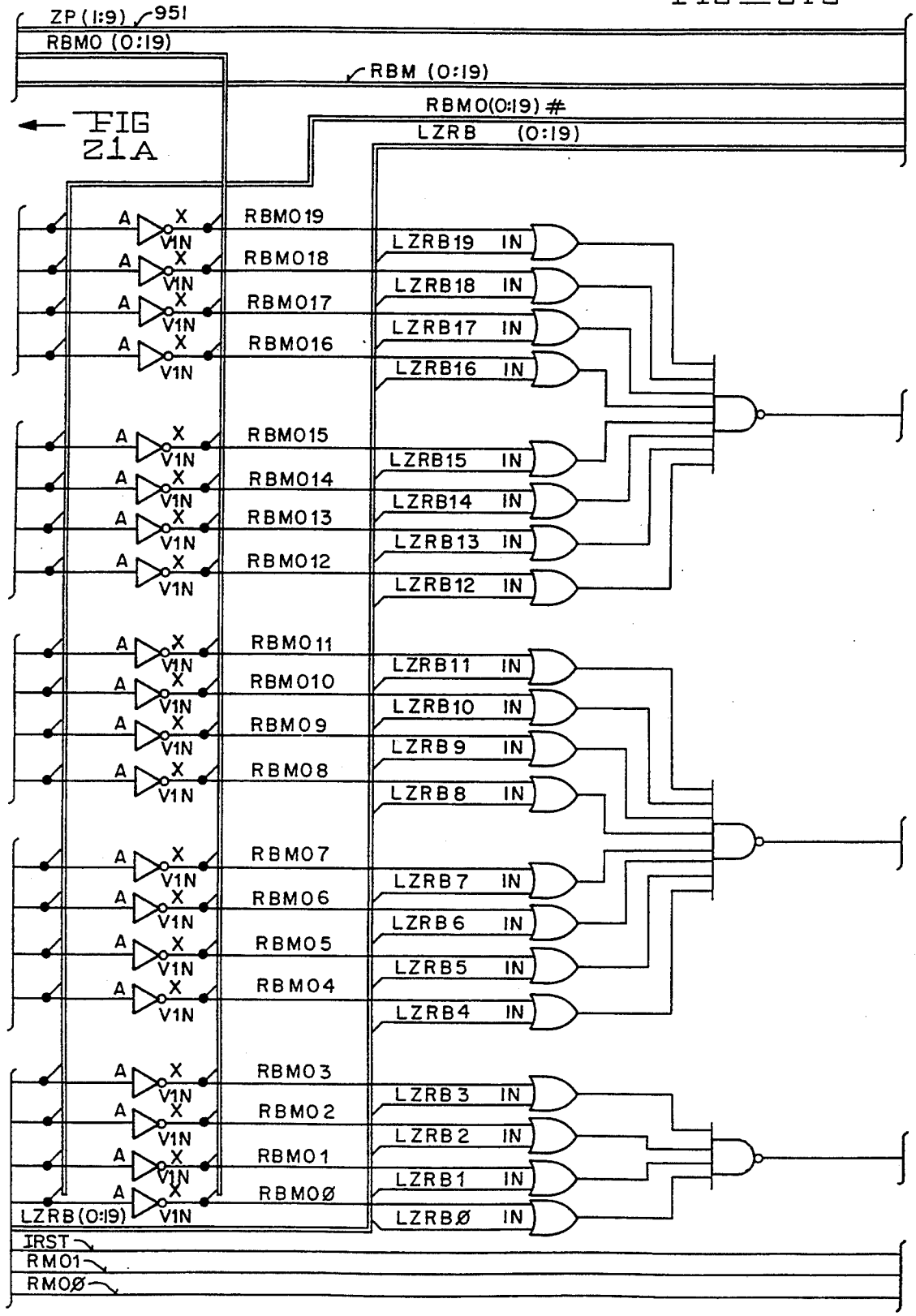

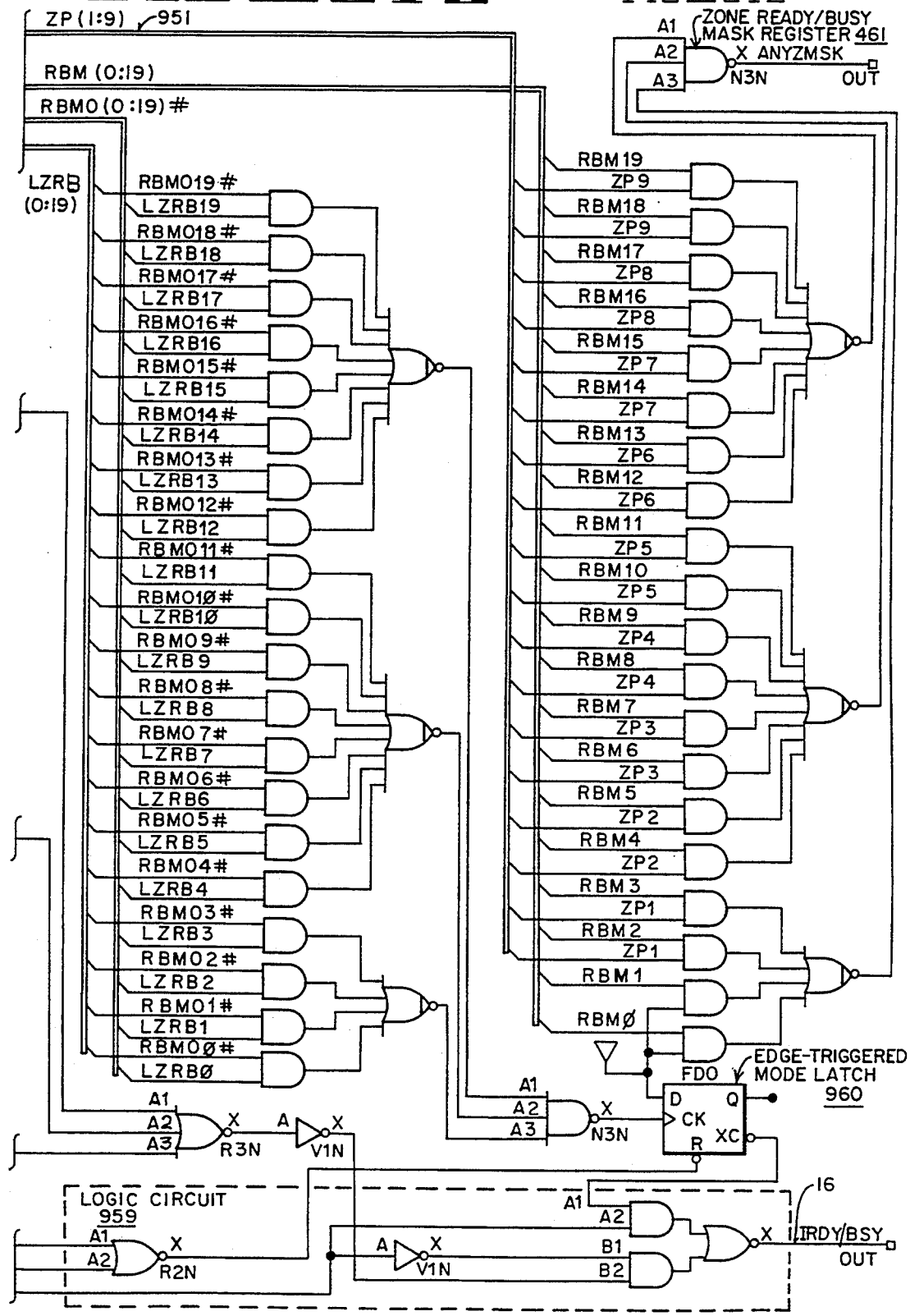

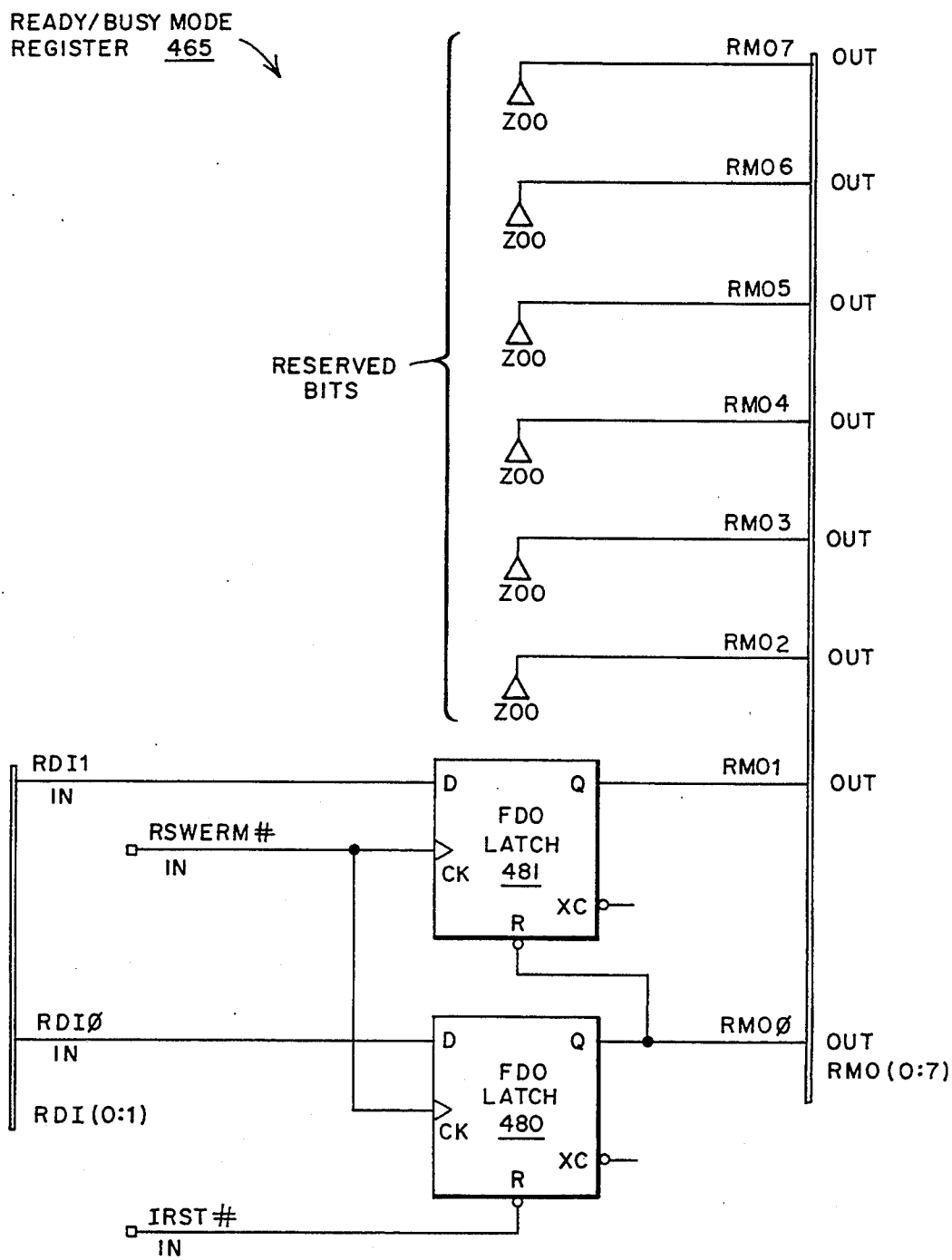
FIG_22

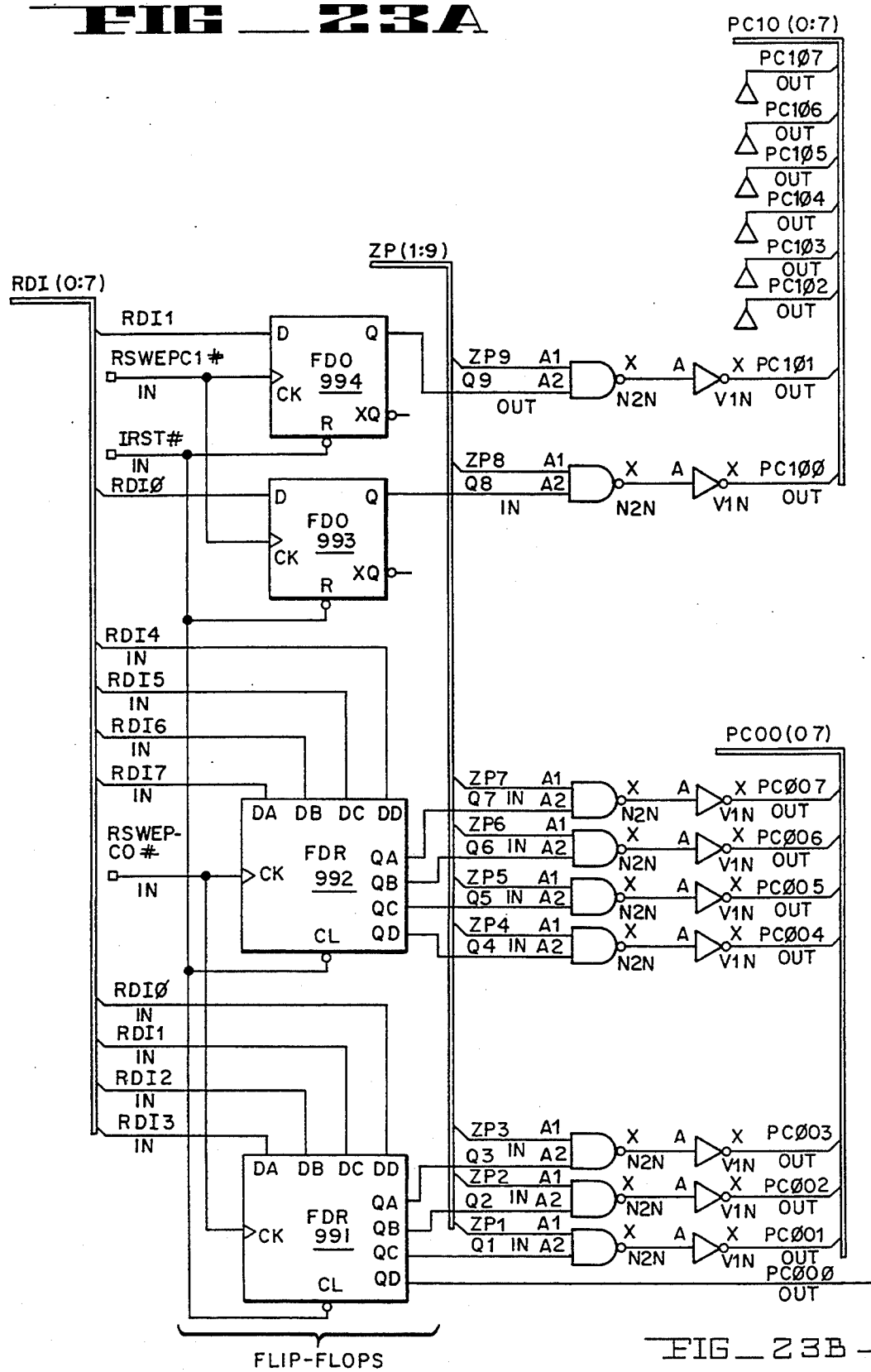
FIG_23A
FIG_23B →

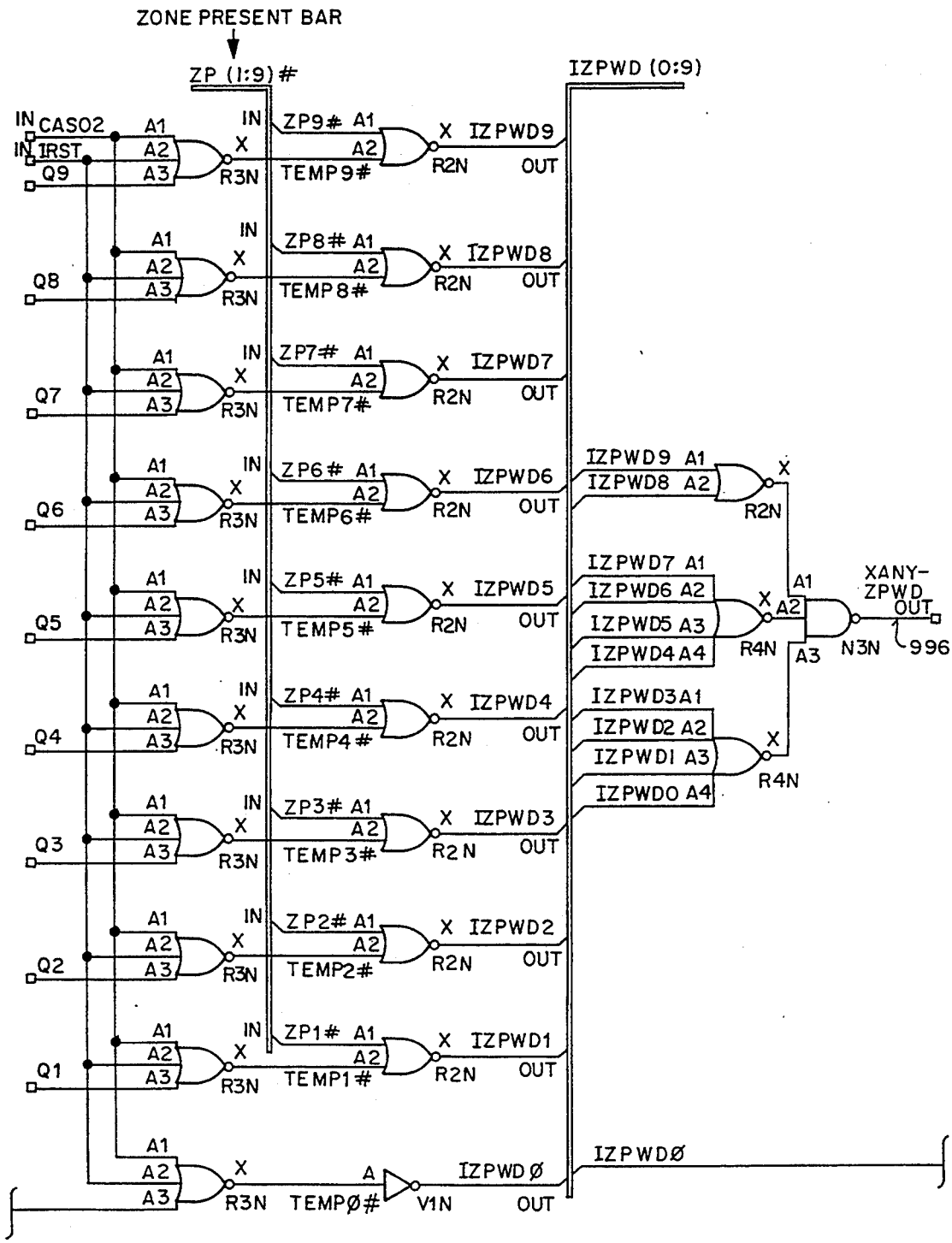

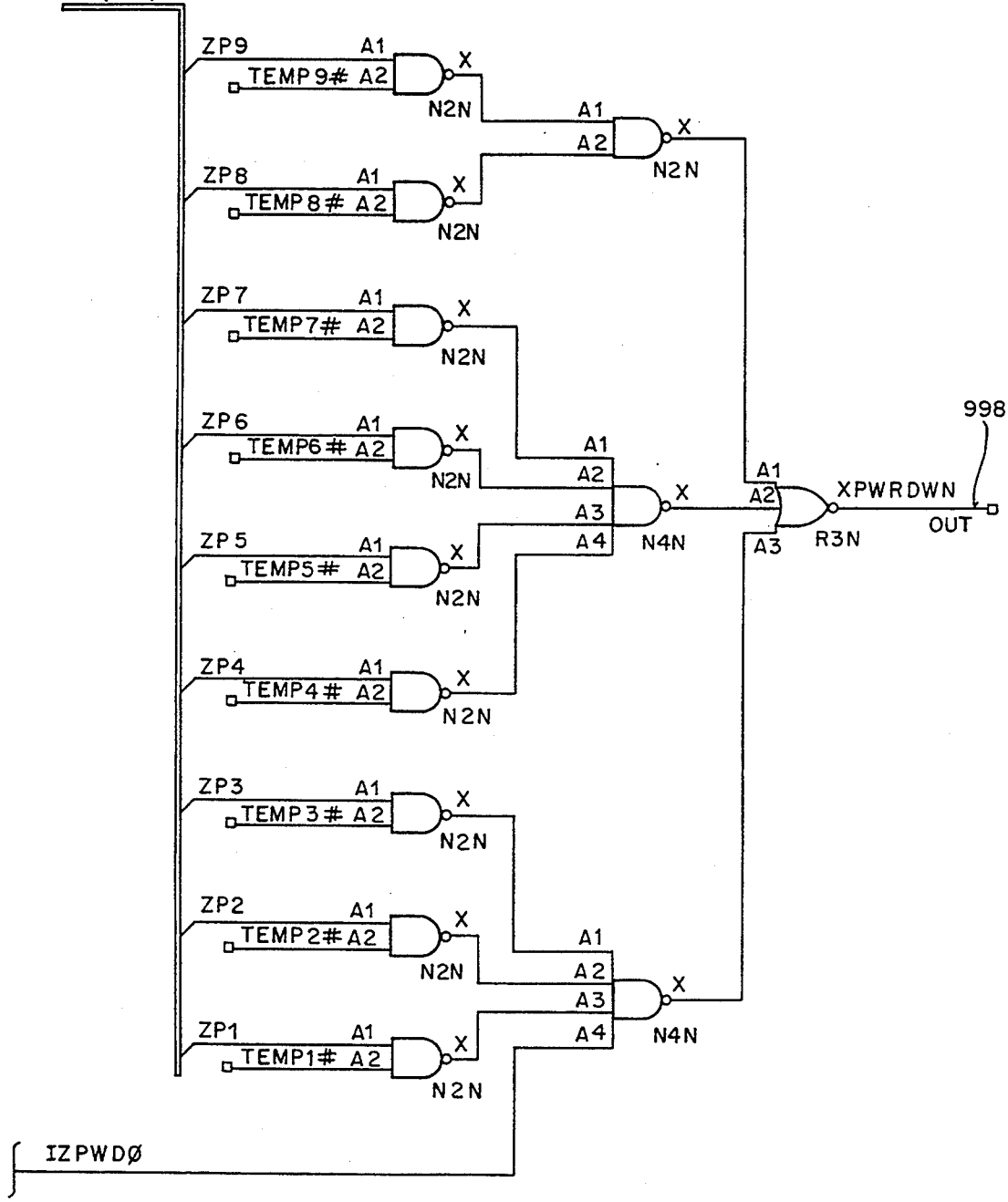

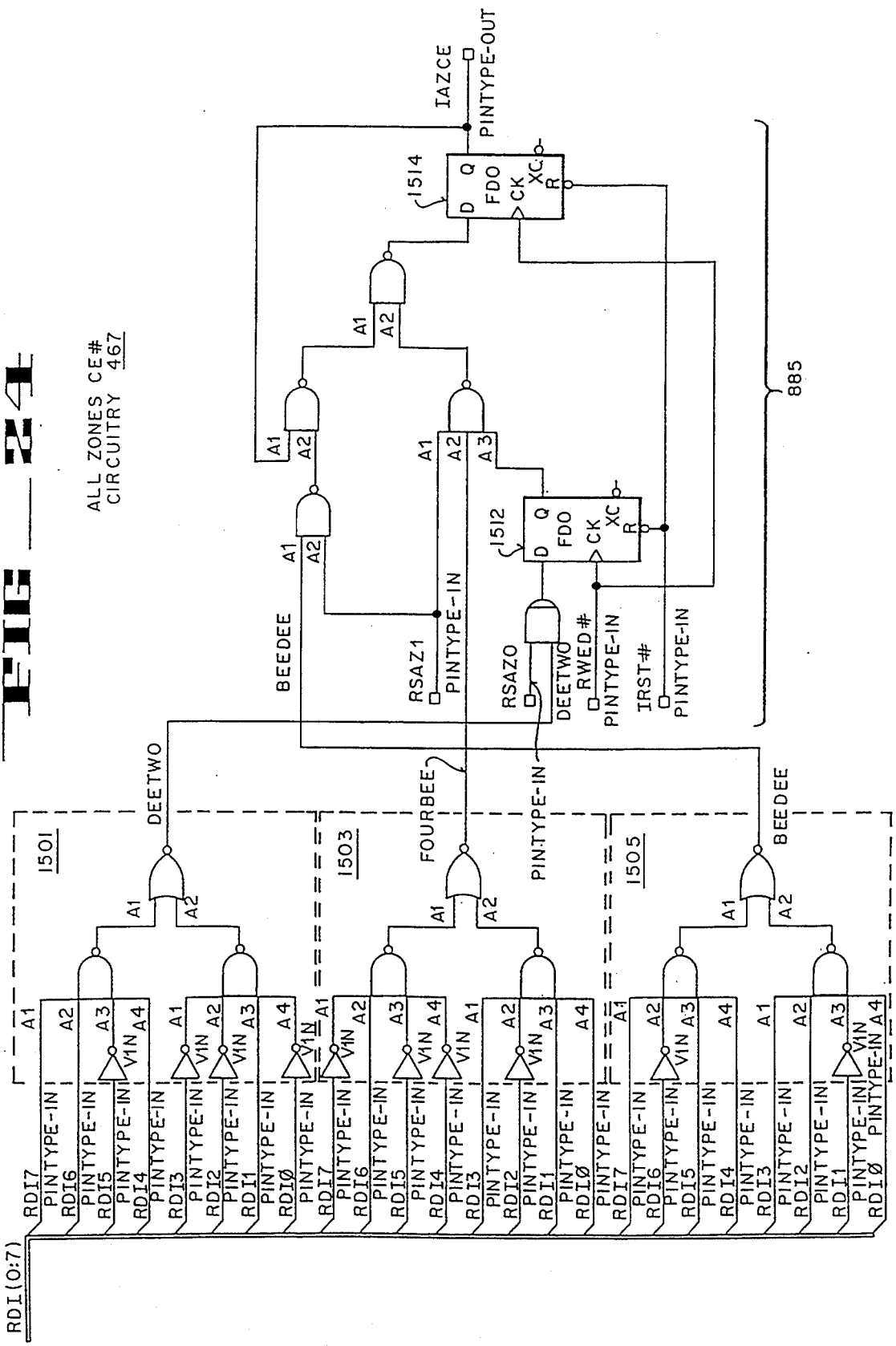
FIG—24

FIG_25A

1001

| TUPLE ADDRESS | VALUE | DESCRIPTION |
|---|---|---|
| ØØH | Ø1H | CISTPL_DEV |
| Ø2H | Ø3H | TPL_LINK |
| Ø4H | 52H | DEVICE_INFO=FLASH 200NS |
|  | 51H | DEVICE_INFO=FLASH 250NS |
| Ø6H | Ø6H | CARD SIZE<br>2M |
|  | ØEH | 4M |
|  | 16H | 6M |
|  | 1EH | 8M |
|  | 26H | 10M |
|  | 2EH | 12M |
|  | 3EH | 16M |
|  | 4EH | 20M |
| Ø8H | FFH | END OF DEVICE |
| ØAH | 1EH | CISTPL_DEVICE GEO |
| ØCH | Ø6H | TPL_LINK |
| ØEH | Ø2H | DGTPL_BUS |
| 10H | 11H | DGTPL_EBS |
| 12H | Ø1H | DGTPL_RBS |
| 14H | Ø1H | DGTPL_WBS |
| 16H | Ø3H | DGTPL_PART |
| 18H | Ø1H | FL_DEVICE INTERLEAVE |
| 1AH | 18H | CISTPL_JEDEC |
| 1CH | Ø2H | TPL_LINK |

FIG_25B

| TUPLE ADDRESS | VALUE | DESCRIPTION |
|---|---|---|
| 1EH | 89H | MANUFACTURER ID |
| 20H | A2H | MEMORY TYPE ID |
| 22H | 15H | CISTPL_VER1 |
| 24H | 50H | TPL_LINK |
| 26H | 04H | TPLLV1 MAJOR |
| 28H | 01H | TPLLV1 MINOR |
| 2AH | 69H | TPLLV1 INFO |
| 2CH | 6EH | |
| 2EH | 74H | MANUF. |
| 30H | 65H | |
| 32H | 6CH | |
| 34H | 00H | END TEXT |
| 36H | 53H | |
| 38H | 45H | |
| 3AH | 52H | TYPE |
| 3CH | 49H | |
| 3EH | 45H | |
| 40H | 53H | |
| 42H | 32H | |
| 44H | 2DH | — |

1002

| TUPLE ADDRESS | VALUE | DESCRIPTION | |
|---|---|---|---|
| | CISTPL_VER1 (CONTINUED) | | |
| 46H | 30H | 2M = 0 | |
| | 30H | 4M = 0 | |
| | 30H | 6M = 0 | |
| | 30H | 8M = 0 | |
| | 31H | 10M = 1 | |
| | 31H | 12M = 1 | |
| | 31H | 16M = 1 | |
| | 32H | 20M = 2 | |
| 48H | 32H | 2M = 2 | |
| | 34H | 4M = 4 | |
| | 36H | 6M = 6 | |
| | 38H | 8M = 8 | |
| | 30H | 10M = 0 | |
| | 32H | 12M = 2 | |
| | 36H | 16M = 6 | |
| | 30H | 20M = 0 | |
| 4AH | 20H | SPACE | |
| 4CH | 00H | END TEXT | |
| 4EH | 32H | CARD TYPE 2 | |
| 50H | 48H | H = 2M, 200 NS | |
| | 49H | I = 4M, 200 NS | |
| | 4AH | J = 6M, 200 NS | |
| | 4BH | K = 8M, 200 NS | |
| | 4CH | L = 10M, 200 NS | |
| | 4DH | M = 12M, 200 NS | |
| | 4EH | N = 16M, 200 NS | |
| | 4FH | O = 20M, 200 NS | |
| | 50H | P = 2M, 250 NS | |
| | 51H | Q = 4M, 250 NS | |
| | 52H | R = 6M, 250 NS | |
| | 53H | S = 8M, 250 NS | |
| | 54H | T = 10M, 250 NS | |
| | 55H | U = 12M, 250 NS | |
| | 56H | V = 16M, 250 NS | |
| | 57H | W = 20M, 250 NS | |

1003

FIG_25C

| TUPLE ADDRESS | VALUE | DESCRIPTION | TUPLE ADDRESS | VALUE | DESCRIPTION |
|---|---|---|---|---|---|
| 52H | 20H | SPACE | 7EH | 50H | P |
| 54H | 52H | R | 80H | 00H | END TEXT |
| 56H | 45H | E | | | |
| 58H | 47H | G | 82H | 43H | C |
| 5AH | 42H | B | 84H | 4FH | O |
| 5CH | 41H | A | 86H | 50H | P |
| 5EH | 53H | S | 88H | 59H | Y |
| 60H | 45H | E | 8AH | 52H | R |
| 62H | 20H | SPACE | 8CH | 49H | I |
| | | | 8EH | 47H | G |
| 64H | 34H | 4 | 90H | 48H | H |
| 66H | 30H | 0 | 92H | 54H | T |
| 68H | 30H | 0 | 94H | 20H | SPACE |
| 6AH | 30H | 0 | 96H | 69H | |
| 6CH | 68H | H | 98H | 6EH | |
| 6EH | 20H | SPACE | 9AH | 74H | |
| 70H | 44H | D | 9CH | 65H | |
| 72H | 42H | B | 9EH | 6CH | |
| 74H | 42H | B | A0H | 20H | MANUF. |
| 76H | 44H | D | | | |
| 78H | 52H | R | A2H | 43H | |
| 7AH | 45H | E | A4H | 4FH | |
| 7CH | 4CH | L | A6H | 52H | |
| | | | A8H | 50H | |
| | | | AAH | 4FH | |

| TUPLE ADDRESS | VALUE | DESCRIPTION |
|---|---|---|
| ACH | 41H | ⎫ |
| AEH | 41H |  |
| B0H | 54H | ⎬ MANUF. |
| B2H | 49H |  |
| B4H | 4FH |  |
| B6H | 4EH | ⎭ |
| B8H | 20H | SPACE |
| BAH | 31H | ⎫ |
| BCH | 39H | ⎬ DATE |
| BEH | 39H |  |
| C0H | 31H | ⎭ |
| C2H | 00H | END TEXT |
| C4H | FFH | END OF LIST |
| C6H | 1AH | CISTPL_CONF |
| C8H | 06H | TPL_LINK |
| CAH | 01H | TPCC_SZ |
| CCH | 00H | TPCC_LAST |
| CEH | 00H | TPCC_RADR |
| D0H | 40H | TPCC_RADR |
| D2H |  | TPCC_RMSK |
| D4H | FFH | END OF LIST |
| D6H | FFH | CISTPL_END |
|  | 00H | INVALID ECIS ADDRESS |

1006

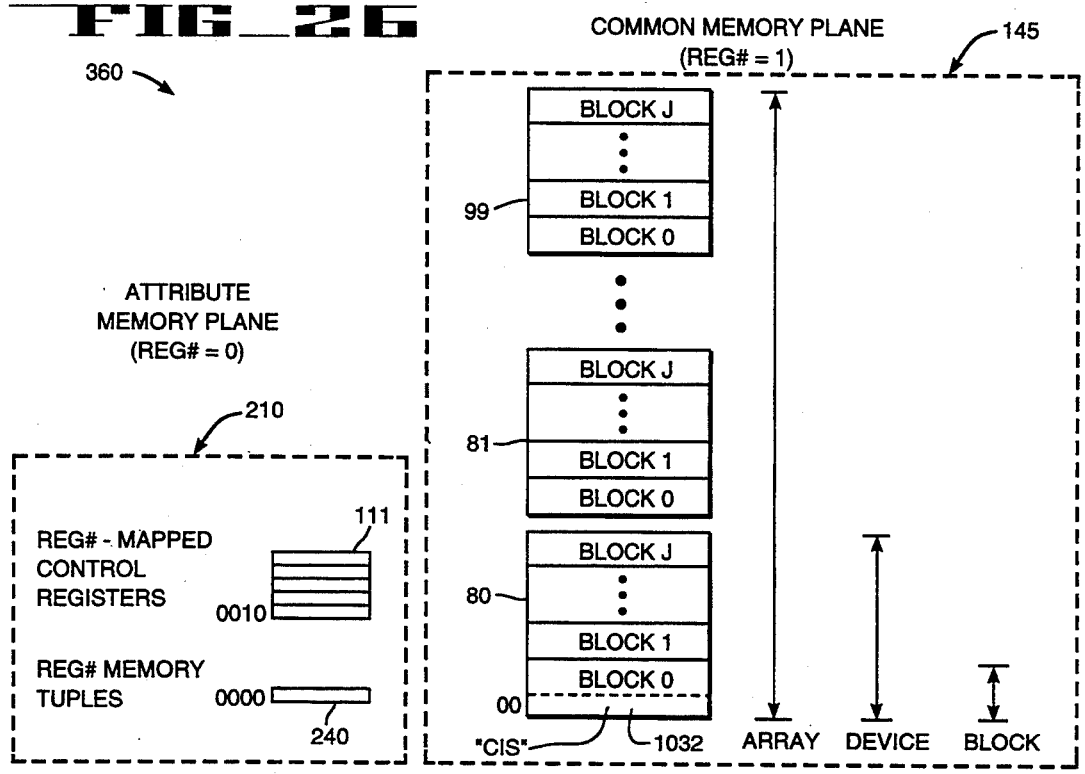
FIG_26
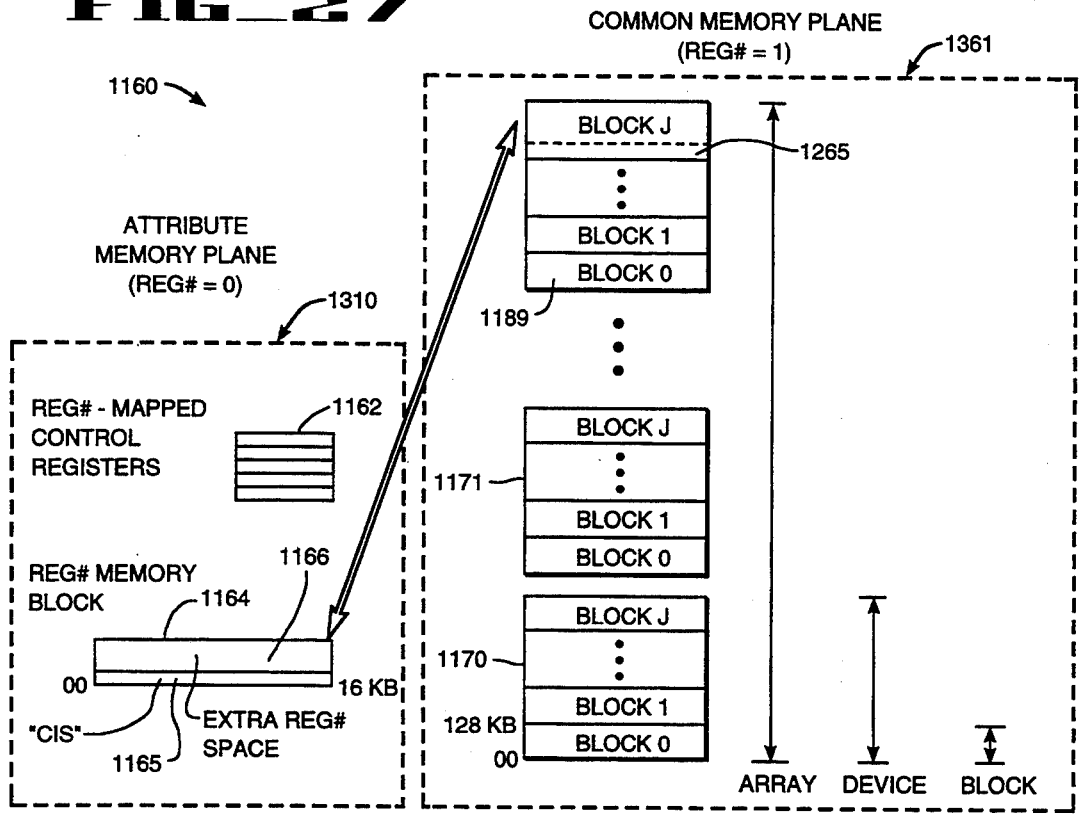
FIG_27

FLASH MEMORY CARD WITH ALL ZONES CHIP ENABLE CIRCUITRY

This is a continuation of application Ser. No. 07/861,373, filed Mar. 31, 1992, now abandoned.

FIELD OF THE INVENTION

The present invention pertains to the field of removable storage devices for storing digital information for computers. More particularly, the present invention relates to a flash memory card with all zones chip enable circuitry.

BACKGROUND OF THE INVENTION

Certain types of prior personal computer systems each include a microprocessor (also referred to as a central processing unit or CPU) that is coupled to several types of storage systems—namely, a read only memory ("ROM"), a random access memory ("RAM") or dynamic random access memory ("DRAM"), a hard (i.e., fixed) disk drive for mass storage, and a floppy disk drive or drives for storage on removable magnetic floppy disks. The floppy disks are also referred to as diskettes.

A relatively new prior mass storage device is a flash memory card. One prior art flash memory card includes flash electrically erasable programmable read only memories ("flash EPROMs") and an electrical connector as part of a plastic package that is smaller than a 3.5 inch floppy disk. The flash memory card can be connected to a personal computer via the electrical connector.

The flash EPROM is a nonvolatile memory that can be programmed by the user. Once programmed, the flash EPROM retains its data until erased. Electrical erasure of the flash EEPROM erases the entire contents of the memory of the device in one relatively rapid operation. The flash EPROM may then be reprogrammed.

That prior flash memory card allows for the storage of data files and application programs on the purely solid-state medium of flash EPROMs. System resident flash filing systems permit the prior flash memory card to function as if it were a physical disk drive. A prior flash memory card in conjunction with a flash filing system provides an alternative to both a fixed hard disk and a floppy disk in a Disk Operating System ("DOS") compatible portable personal computer ("PC").

The storage of user application software on a prior flash memory card substantially reduces the relatively slow prior disk-DRAM download process. That prior flash memory card can be read from faster than certain prior hard disk drives. That prior flash memory card generally uses less power than certain prior hard disk drives. That prior flash memory card is also smaller and lighter than certain prior hard disk drives.

Prior personal computers typically have a redundant memory structure—i.e., there is a DRAM for storage of applications and data to be executed plus a hard disk or a floppy disk for mass storage. Applications and data need to be loaded into the DRAM.

The prior flash memory card, however, has a read access time and a command register microprocessor write interface that permits an "execute-in-place" architecture. This configuration eliminates the need for a DRAM. Thus, redundancy associated with having both a DRAM and disk drive is eliminated.

Certain prior flash memory cards can be transported from personal computer to personal computer. Moreover, the flash EPROMs of certain prior flash memory cards are nonvolatile and thus do not require a battery back-up.

One type of prior flash EPROM used in a prior flash memory card has a standby mode that disables most of the flash EPROM circuitry and reduces device power consumption. The prior flash EPROM also has an active mode. The active mode requires increased power consumption. The active mode is used when the flash EPROM is being written to, read from, or erased.

One disadvantage, however, of certain prior flash memory cards is that a microprocessor has to step through relatively complex erasure or programming software routines in order to erase or program the flash memory card.

Another disadvantage of certain prior flash memory cards is that even when the flash EPROMs making up the card are in the standby mode, the flash memory card still consumes a significant amount of power. The amount of power consumed by a flash memory card with flash EPROMs in the standby mode is especially noticeable when the flash memory card is used in conjunction with a battery-powered laptop personal computer. In order to extend battery life, power consumption must be kept to a minimum for a battery-powered laptop personal computer.

Recently, improvements have been made in prior flash EPROMs. Memory capacity has been increased. In addition, one type of prior flash EPROM includes a write state machine on the flash EPROM chip.

The write state machine comprises circuitry that automatically steps the flash EPROM through a multi-step program or erasure sequence upon receiving an initiating command from a microprocessor. The flash EPROM includes a ready/busy output pin that indicates whether the write state machine is ready to accept a command or whether the write state machine is currently busy programming or erasing the flash EPROM.

That type of prior flash EPROM also includes a power down mode that can be initiated by applying a logical signal to a power down pin. In the power down mode, the flash EPROM consumes less power than in the standby mode.

SUMMARY AND OBJECTS OF THE INVENTION

One object of the present invention is to provide an apparatus and method for controlling individual flash memories of a flash memory card.

Another object of the present invention is to include in a flash memory card means for placing a plurality of flash memories in an active mode concurrently.

A flash memory card is described that has first, second, and third flash memories. The first flash memory has a chip enable input for selecting an active mode for the first flash memory upon receipt of a first signal and a standby mode for the first flash memory upon receipt of a second signal. The second flash memory has a chip enable input for selecting an active mode for the second flash memory upon receipt of a third signal and a standby mode for the second flash memory upon receipt of a fourth signal. The third flash memory has a chip enable input for selecting an active mode for the third flash memory upon receipt of a fifth signal and a standby mode for the third flash memory upon receipt of a sixth signal. The flash memory card includes addressable means for selectively causing first, third, and fifth signals to be concurrently applied to the respective chip enable inputs of the first, second, and third flash memories upon receipt of first data in order to have the first, second, and third flash memories operating in the active mode concurrently.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which:

FIG. 1 is a perspective view of a flash memory card.

FIG. 2 shows a connector of the flash memory card.

FIG. 3 is a table identifying pins of the connector of the flash memory card.

FIG. 4 shows the memory organization of two flash EPROMs of the flash memory card.

FIGS. 5A, 5B and 5C show the card control logic and the flash EPROMS of the flash memory card.

FIG. 6 is a high level block diagram of the card control logic circuitry of the flash memory card.

FIG. 7 shows memory maps of the attribute memory plane and the component management registers.

FIG. 8 is a data access mode truth table.

FIG. 9 is a bit map of the zone ready/busy mask register.

FIG. 10 is a bit map of the ready/busy mode register.

FIG. 11 is a bit map of the zone ready/busy status register.

FIG. 12 is a bit map of the power control register.

FIG. 13 is a bit map of the configuration and status register.

FIG. 14 is a bit map of the write protection register.

FIG. 15 is a bit map of the configuration option register.

FIG. 16 is a bit map of the card status register.

FIG. 17 is a bit map with respect to all zones chip enable circuitry.

FIGS. 18A, 18B, 18C, and 18D are diagrams of the card control circuitry containing the attribute memory plane.

FIGS. 19A, 19B, and 19C are diagrams of circuitry within the attribute memory plane.

FIG. 20 is a diagram of the zone present circuitry.

FIGS. 21A, 21B, and 21C are diagrams of the zone ready/busy mask circuitry.

FIG. 22 is a circuit diagram of the ready/busy mode register.

FIGS. 23A, 23B, and 23C are circuit diagrams of the power control register.

FIG. 24 is a circuit diagram of the all zones chip enable circuitry.

FIGS. 25A, 25B, 25C, and 25D show the tuples for the hardwired card information, structure of the flash memory card.

FIG. 26 shows the architecture of the flash memory card.

FIG. 27 shows the architecture of an alternative flash memory card.

DETAILED DESCRIPTION

Figure 18A:
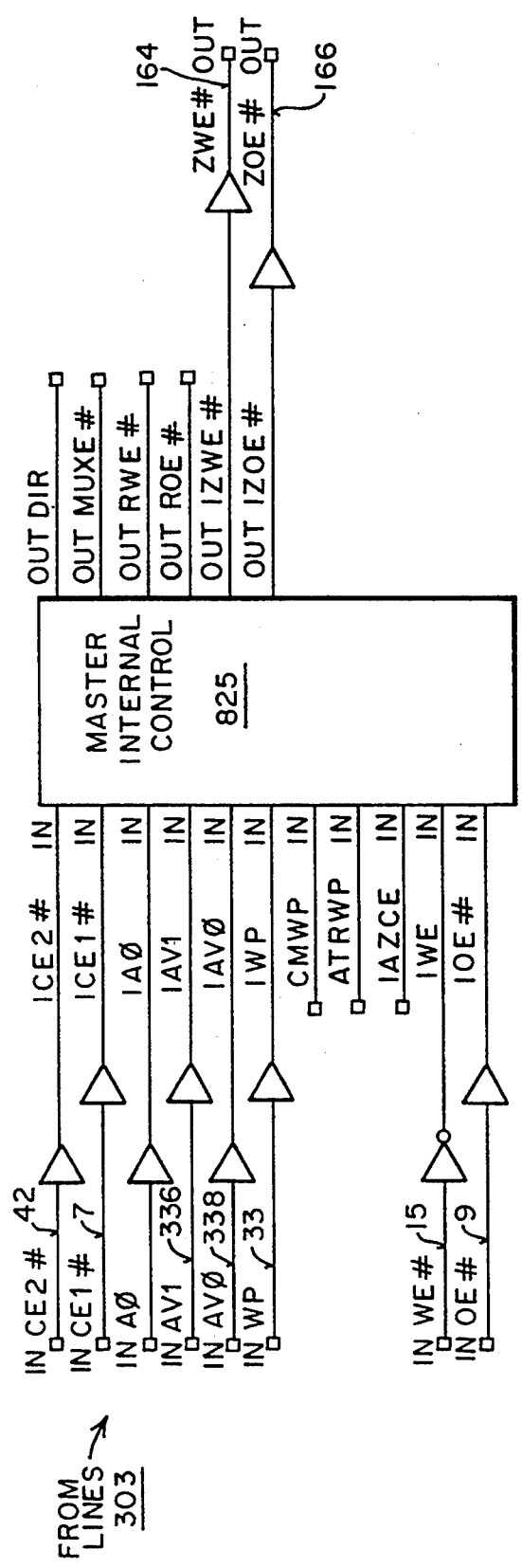

FIG. 1 shows flash memory card 110. Flash memory card 110 is made of plastic and encloses flash EPROMs. Preferred flash memory cards have from two to twenty flash EPROMs. Alternative flash memory cards have more or fewer flash EPROMs. For the embodiment discussed below, flash memory card 110 has twenty flash EPROMs.

Each flash EPROM is a nonvolatile memory that has a storage capacity of eight megabits. The total storage capacity of flash memory card 110 with twenty flash EPROMs is twenty megabytes. Flash memory card 110 is also referred to as flash card 110 or PC card 110.

Flash memory card 110 is used in conjunction with personal computer 101. For one embodiment, flash memory card 110 is an alternative to either a floppy disk or a fixed hard disk for personal computer 101. Flash memory card 110 can be used to store data, code, applications, or other information that is normally stored on a floppy disk or a fixed or hard disk. Flash memory card 110 is also an alternative to an optical disk (i.e., a CD-ROM).

As described in more detail below, flash memory card 110 includes card control logic that controls and oversees the operation of flash memory card 110. The card control logic includes an attribute memory plane that includes registers that can be written to and read from. That attribute memory plane includes a ready/busy mask register, a ready/busy mode register, a power control register, and a configuration and status register.

The ready/busy mask register is used to mask the ready/busy outputs of the flash EPROMs that are part of flash memory card 110.

A ready/busy mode register is used to chose one of two modes for using unmasked ready/busy outputs. For a "logical AND" mode, flash memory card 110 provides a "ready" output signal to the outside world only if all the unmasked flash EPROMs are ready. If any unmasked flash EPROM is busy, then flash memory card 110 provides a "busy" output signal to the outside world.

If, on the other hand, an "edge-triggered" mode is chosen using the ready/busy mode register, then a ready signal is generated for flash memory card 110 each time any unmasked flash EPROM goes from a busy state to a ready state, regardless of the ready or busy status of all other flash EPROMs of flash memory card 110. In other words, the edge-triggered mode permits an edge-triggered "ready" acknowledgement.

The power control register is used to control power down inputs to the flash EPROMs of flash memory card 110. A power down input for a particular flash EPROM places that flash EPROM into a power down mode in which power consumption by that flash EPROM is significantly reduced.

The configuration and status register includes a global power down bit that is used to place all the flash EPROMs at once into the power down mode. Information in the power control register is retained from a time prior to the entering of the global power down mode to a time after exiting the global power down mode.

Flash memory card 110 also includes zone present circuitry that is responsive to card size jumpers. The zone present circuitry permits only certain signals to pass through certain gates— namely, those signals that are expected to be present in view of number of flash EPROMs in flash memory card 110.

Flash memory card 110 includes all zones chip enable circuitry for placing all the flash memories of the flash memory card in the active mode concurrently. The all zones chip enable circuitry allows an end user to write to or erase a particular block in each of the flash memories of the flash memory card concurrently.

Flash memory card 110 is coupled to personal computer 101 via an electrical connector 112. The microprocessor of personal computer 101 reads information stored in flash memory card 110 via electrical connector 112. The microprocessor that is part of personal computer 101 also writes information to flash memory card 110 via electrical connector 112. Connector 112 is also used to send and receive control and status signals with respect to flash memory card 110.

For one embodiment, flash memory card 110 is removable from personal computer 101. For one embodiment, flash memory card 110 is approximately 3.370 inches long, 2.126 inches wide, and approximately 0.13 inches thick. Thus, flash memory card 110 is of a relatively small size.

For an alternative embodiment, flash memory card 110 is connected at a point inside the casing of personal computer 101 and is not easily removable. For yet another alternative embodiment, the card control circuitry and flash EPROMs of flash memory 110 are mounted on a motherboard of personal computer 101.

Flash memory card 110 includes a two position write protect switch 116. When the write protect switch 116 is in one position, the card control logic of flash memory card 110 prevents any writing of data to the flash EPROMs of flash memory card 110. When write protect switch 116 is placed in another position, the writing of data to the flash EPROMs is permitted.

FIG. 2 is a front view of flash memory card 110 showing electrical connector 112. Electrical connector 112 includes 68 metallic female pins through which electrical connection is made between flash memory card 110 and host computer 101.

FIG. 3 shows table 130 that sets forth each pin of connector 112, the signal with respect to each pin, and the function of each pin. Table 130 also indicates whether a particular pin is an input ("1") pin for flash memory card 110, and output ("0") pin for flash memory card 110, or an input/output ("I/O") pin for flash memory card 110.

Pins 2, 3, 4, 5, 6, 30, 31, 32, 37, :38, 39, 40, 41,64, 65, and 66 are input/output pins for data bit signals DQ0 through DQ15. Signals DQ0 through DQ15 comprise the data sent to and from flash memory card 110 and personal computer 101. Bit DQ15 is the most significant bit. Bit DQ0 is the least significant bit.

Pins 8, 10, 11, 12, 13, 14, 19, 20, 21, 22, 23, 24, 25, 26, 27, 28, 29, 46, 47, 48, 49, 50, 53, 54, and 55 are input pins for address input signals A0 through A24. Signals A0 through A24 comprise the address sent to flash memory card 110 by host computer 1 01. Bit A24 is the most significant address bit. Bit A0 is the least significant address bit. Bit A0 is not used in the word wide addressing mode. The word wide addressing mode is described in more detail below.

Pin 7 is the input pin for the card enable one ("CE1#") signal provided by host computer 101. Pin 42 is an input pin for the card enable two ("CE2#") signal provided by host computer 101. The active low CE1# and CE2# signals are used in addressing the flash EPROMs of flash memory card 110.

FIG. 4 illustrates the memory organization of flash EPROMs 80 and 81 that are two of the twenty flash EPROMs of flash memory card 110. There are two addressing modes for flash memory card 110. One mode is the word wide mode, which is also referred to as the "by sixteen" mode or the sixteen bit mode. For the word wide addressing mode, each data word is sixteen bits wide.

For the word wide addressing mode, there is an increment of two (hexadecimal) between each address. As a result, the value of address bit A0 (the least significant address bit) is irrelevant in the word wide addressing mode.

The other data addressing mode is the byte wide mode, which is also referred to as the "by eight" mode or the eight bit mode. For the byte wide addressing mode, each data word is eight bits wide. For the byte wide addressing mode, a binary one value for address bit A0 means an odd byte, and a binary zero value for bit A0 means an even byte.

For one embodiment, flash memory card 110 has twenty individual flash EPROMs. Each flash EPROM contains sixteen separate individually erasable sixty-four kilobyte blocks. Each of those sixty-four kilobyte blocks is designated either as a high zone block or a low zone block.

As shown in FIG. 4, flash EPROM 80 contains 16 logical zone blocks. Flash EPROM 81 contains 16 logical zone blocks.

For the embodiment shown in FIG. 4, all the blocks of flash EPROM 80 are high zone blocks. For example, block 147 is a high zone block and block 141 is a high zone block. All sixteen zones of flash EPROM 81 are low zone blocks. For example, block 143 is a low zone block and block 149 is a low zone block.

Each block pair consists of one high zone block and one low zone block. For example, block pair 142 consists of high zone block 144 and low zone block 146. For one embodiment, block pair 142 is 128 kilobytes in size.

When two flash EPROMs are paired together in the word wide mode, they are considered a zone pair. Thus, in the word wide mode, flash EPROMs 80 and 81 comprise zone pair 148.

In the word wide addressing mode, the high zone block consists of high bytes. Each high byte consists of data bits D8 through D15. In the word wide mode, each low zone block consists of low bytes. Each low byte consists of data bits D0 through D7. For example, in the word wide mode high zone block 144 would contain high bytes of the data words. Low zone block 146 would contain the low bytes of the data words. Each data word consists of a combination of a high byte and a low byte.

For the byte wide addressing mode, each high zone block consists of odd bytes. Each low zone block consists of even bytes. For the byte wide mode, a word is only eight bits wide. Thus, each high zone block contains odd byte words. Each low zone block contains even byte words. Each odd byte word consists of bits D8 through D15. Each even byte word consists of bits D0 through D7. For byte wide addressing, each high zone block is also referred to as an odd zone block and each low zone block is also referred to as a even zone block.

Flash memory card 110 has ten flash EPROM pairs, each pair having a organization similar to that of flash EPROMs 80 and 81. There are one hundred sixty zone blocks on flash memory card 110 and ten zone pairs of flash EPROMs.

Returning to FIG. 3, pin 9 is an input pin for the active low output enable signal ("OE#") driven by host computer 101. When the OE# signal is applied to a flash EPROM OE# input, output data from a memory array in that flash EPROM is gated through the flash EPROM's data buffers during a read cycle. In short, the OE# signal permits data to be read from the flash EPROMs of flash memory card 110.

Pin 15 is an input pin for the write enable signal ("WE#"). The WE# signal is an active low signal driven by host computer 101. When the WE# signal is applied to a flash EPROM WE# input, an address applied to the flash EPROM is latched on the falling edge of a WE# pulse and data is latched on a rising edge of a WE# pulse;. Thus, the WE# signal is used to control the writing of data to the flash EPROMs of flash memory card 110.

Pin 16 is an output pin for the active low ready/busy output ("RDY/BSY#") of flash memory card 110. A high ready/busy output indicates that memory card 110 is ready to accept memory reads and writes. A low ready/busy output indicates that memory card 10 is busy with internally timed erase or write activities with respect to the flash EPROMs of flash card 110.

Pins 36 and 67 are output pins for active low card detect one signal ("CD1#") and active low card detect two signal ("CD2#"), respectively. The CD1# and CD2# signals help to ensure correct memory card 110 insertion.

Pin 33 is an output pin for write protect signal WP that reflects the status of the physical write protect switch 116 of flash memory card 110. If the WP signal is logically high, this indicates that switch 116 is set to a write protect setting, which causes flash memory card 110 to be write protected. If WP has a logical low value, then switch 116 is not set to a write protect setting.

Pin 18 is a pin to which host computer 101 supplies the voltage $V_{PP1}$. Pin 52 is the pin to which host computer 101 supplies the voltage $V_{PP2}$. $V_{pp1}$ and $V_{pp2}$ are the erase and write power supply voltages for erasing or writing data in the flash EPROMs of flash memory card 110. The voltages $V_{pp1}$ and $V_{pp2}$ must be at approximately 12 volts for an erase or write operation to be performed.

Pins 17 and 51 are the pins host computer 101 supplies the voltage $V_{CC}$. The voltage $V_{CC}$ is the five volt power supply voltage for flash memory card 110.

Host computer 101 supplies ground ("$V_{SS}$") to pins 1, 34, 35, and 68 of flash memory card 110.

Pin 61 is an input pin for the active low register select signal ("REG#"). The REG# signal sent by host computer 101 allows host computer 101 to access the registers of the attribute memory plane of flash memory card 110, as described in more detail below.

Pin 58 is an input pin for the active high reset signal ("RST"). A logically high RST signal is sent by host computer to reset flash memory card 110.

Pins 62 and 63 are output pins for the battery voltage detect signals BVD2 and BVD1, respectively. For one embodiment, battery voltage detect signals BVD2 and BVD1 are not used. Pins 44, 45, 57, and 60 are reserved for future use. Pins 43 and 45 have no internal connection to flash memory card 110.

Pin 59 is an active low extend bus cycle output pin WAIT#. For one embodiment, pin 59 is always tied logic;ally high.

FIGS. 5A, 5B, and 5C comprise a block diagram of circuitry 140 within of flash memory card 110. Twenty flash EPROMs 80-99 are connected to card control logic 150 of flash memory card 110. Flash EPROMs 80-99 comprise common memory plane 145 (see FIGS. 5A-5C) of flash memory card 110. For one embodiment, each of the flash EPROMs 80-99 can store eight megabits of digital information.

In other embodiments, fewer or more than twenty flash EPROMs are used in flash memory card 110. In alternative embodiments, larger or smaller individual flash EPROMs are used.

Each flash EPROM is assigned a zone number. Flash EPROMs 80-99 comprise zones 0 through 19, respectively. Flash EPROMs 80-99 are organized into the following zone pairs: (1) flash EPROMs 80 and 81 (zone pair 0), (2) flash EPROMs 82 and 83 (zone pair 1), (3) flash EPROMs 84 and 85 (zone pair 2), (4) flash EPROMs 86 and 87 (zone pair 3), (5) flash EPROMs 88 and 89 (zone pair 4), (6) flash EPROMs 90 and 91 (zone pair 5), (7) flash EPROMs 92 and 93 (zone pair 6), (8) flash EPROMs 94 and 95 (zone pair 7), (9) flash EPROMs 96 and 97 (zone pair 8), and (10) flash EPROMs 98 and 99 (zone pair 9).

Each flash EPROM of flash EPROMs 80-99 has a Vss (i.e., ground) input and a $V_{CC}$ 5 volt power supply input. Flash EPROMs 80, 82, 84, 86, 88, 90, 92, 94, 96, and 98 each have a $V_{pp1}$ input. Flash EPROMs 81, 83, 85, 87, 89, 91, 93, 95, and 97 and 99 each have a $V_{pp2}$ input. The $V_{pp1}$ and $V_{PP2}$ voltages are the 12 volt erase/programming power supply voltages for writing to a command register of a respective flash EPROM, for erasing an entire memory array of a respective flash EPROM, and for programming bytes in the memory array of the respective flash EPROM.

Each of the flash EPROMs 80-99 has an active low CE# input. The CE# input is the chip enable input that activates a particular flash EPROM's control logic, input buffers, decoders, and sense amplifiers.

When a logical high signal is applied to the CE# input of a particular flash EPROM, that flash EPROM is selected and the flash EPROM becomes active. In other words, the flash EPROM enters the active mode. When that flash EPROM is active, the flash EPROIV1 can be read from, erased, and programmed. Erasure and programming also requires 12 volts being applied to the respective $V_{pp1}$ or $V_{pp2}$ input.

$I_{CC}$ is the current flowing through the $V_{CC}$ input of a particular flash EPROM of flash EPROMs 80-99. $I_{pp1}$ and $I_{pp2}$ are the currents flowing through the $V_{pp1}$ and $V_{pp2}$ inputs of a particular flash EPROM.

When a particular flash EPROM is active as the result of a logical low CE# input, the $I_{CC}$ current for that active flash EPROM is on the order of about 10 milliamps to 50 milliamps. If the active flash EPROM is being erased or programmed, the Ipp current for that active flash EPROM is on the order of 10 milliamps to 50 milliamps.

A logical high signal sent to the CE# input deselects the particular flash EPROM and reduces its power consumption to a standby level. Deselecting a particular flash EPROM by sending a logical high signal to the flash EPROM's CE# input is also referred to as placing the flash EPROM in a standby mode.

The lot current for a flash EPROM in the standby mode is on the order of about 1 milliamp. The $I_{pp1}$ or $I_{pp2}$ current for a particular flash EPROM in the standby mode is on the order of about 10 microamps.

Each of the flash EPROMs 80-99 includes an active low power down ("PWD#") input. If a logical low signal is sent to a PWD# input of a particular flash EPROM, then that flash EPROM enters the power down mode. In the power down mode, the flash EPROM consumes even less power (i.e., less current) than the flash EPROM does in the standby mode. The power down mode is also referred to as a deep sleep mode.

In the power down mode, power is removed from nearly all the circuits of the flash EPROM. For a flash EPROM in the power down mode, power is removed, for example, from a write state machine, a command state machine, a synchronizer, a status register, X and Y decoders, control logic, input buffers, and sense amplifiers (not shown) of the flash EPROM. A flash EPROM in the power down mode cannot be erased or written to.

The power down mode overrides both the active mode and the standby mode for the particular flash EPROM. In other words, a logical low signal applied to the PWD# input of a particular flash EPROM places that flash EPROM into the power down mode regardless of whether its CE# input is logically low or high— i.e., regardless of whether the flash EPROM is in the active mode or the standby mode.

A logical high signal applied to the PWD# input, however, means that the particular flash EPROM is not in the power down mode. A logically high signal applied to the PWD# input takes a particular flash EPROM out of the power down mode if the flash EPROM previously was in the power down mode. When the PWD# input is logically high, the flash EPROM is (1) placed into the active mode if the CE# input is logically low and (2) placed into the standby mode if the CE# input is logically high.

The Icc current for a particular flash EPROM in the power down mode is on the order of about one microamp. The $I_{pp1}$ or $I_{pp2}$ current for a particular flash EPROM in the power down mode is on the order of about one microamp.

A significant portion of the power consumption of flash memory card 110 is made up of the total power consumption of flash EPROMs 80-99. The power down mode significantly reduces the power consumed by a particular flash EPROM. Placing one or more of the flash EPROMs 80-99 in the power down mode reduces the power consumption of flash memory card 110.

For one embodiment of the present invention, host computer 101 is a battery powered portable personal computer. Host computer 101 supplies power to flash memory card 110, so reducing the power consumption of flash memory card 110 helps to extend the battery life of a battery (not shown) powering personal computer 101.

A particular flash EPROM in the power down mode will not react to high or low signals applied to the CE# input or to write enable WE# and output enable OE# control inputs. It follows from this that the power down mode also provides protection against inadvertent erasure or programming of a particular flash EPROM.

Each of the flash EPROMs 80, 82, 84, 86, 88, 90, 92, 94, 96, and 98 includes data inputs and outputs DQ7 through DQ0. Each of the flash EPROMs 81,83, 85, 87, 89, 91,93, 95, 97, and 99 includes data inputs and outputs DQ15 through DQ8. Data is sent to a flash EPROM as an input during a memory write cycle. Data is provided as an output from a flash EPROM during a memory read cycle. The data pins of the flash EPROM are either high or low depending on the data. The data pins of the flash EPROM float to a tristate off state when the flash EPROM is deselected or outputs of the flash EPROM are disabled. Data is internally latched during a write cycle.

Each of the flash memory EPROMs 80-99 also includes a write enable input ("WE#") that is active low. The WE# input controls write operations to a control register and memory array (not shown) of the particular flash EPROM. Addresses are latched on the falling edge of WE# pulse and data is latched on the rising edge of a WE pulse#. Nevertheless, if a WE pulse is sent to a flash EPROM when the respective $V_{pp1}$ or $V_{pp2}$ voltage applied to the flash EPROM is less than or equal to approximately 6.5 volts, the contents of the memory array of the flash EPROM cannot be altered.

Each one of flash EPROMs 80-99 includes address inputs A19 through A0. The address inputs are for addressing a memory array of a flash EPROM. Addresses are internally latched during a write cycle.

Each one of flash EPROMs 80-99 has an active low output enable input ("OE#"). A logical low signal applied to the OE# input of a particular flash EPROM gates a data output of the particular flash EPROM through data buffers (not shown) of that flash EPROM during a read cycle.

In a preferred embodiment, each one of the flash EPROMs 80-99 includes an on-chip write state machine (not shown). Each write state machine comprises circuitry that automatically steps the flash EPROM through a multistep program or erasure sequence once the flash EPROM receives an initiation command. In other words, the write state machine of a flash EPROM carries out internally timed erasure or programming of a flash EPROM.

Each of the flash EPROMs 80-99 has a ready/busy output ("RY/BY#") that indicates whether the write state machine of the particular flash EPROM is ready to accept a command (to initiate erasure or programming) or whether the write state machine is currently busy programming or erasing the memory array of the flash EPROM. The RY/BY# output of each of flash EPROMs 80-99 is active low. A logically high RY/BY# output of a flash EPROM indicates a "ready" condition or mode (i.e., ready to accept a command for initiating erasure or programming). A logically low RY/BY# output of a flash EPROM indicates a "busy" condition or mode (i.e., the write state machine is presently erasing or programming).

Circuitry 140 of flash memory card 110 includes card control logic 150 that controls the overall operation of flash memory card 110. Card control logic 150 receives and sends data bits E)Q0 through DQ15 (also referred to collectively as data bits DQ (15:0)) on pins 2, 3, 4, 5, 6, 30, 31, 32, 37, 38, 39, 40, 41,64, 65, and 66 (collectively referred to as pins 301) of flash memory card 110. Card control logic 150 receives addresses bits A24 through A0 (also collectively referred to as (A24:0))on pins 8, 10, 11, 12, 13, 14, 19, 20, 21,22, 23, 24, 25, 26, 27, 28, 29, 46, 47, 48, 49, 50, 53, 54, and 55 (collectively referred to as pins 303) of flash memory card 110.

Card control logic 150 is also coupled to WE# pin 15, OE# pin 9, RDY/BSY# pin 16, RST# pin 58, REG# pin 61, CEI# pin 7, CE2# pin 42, RFU# pin 59, BVDI# pin 63, BVD2# pin 62, and WP pin 33 of flash memory card 110. WP pin 33 is in turn coupled to write protect switch 116.

Data bits ZDQ15 through ZDQ8 (also collectively referred to as ZDQ (15:8)) are sent to and from card control logic 150 and flash EPROMs 81, 83, 85, 87, 89, 91,93, 95, 97, and 99 via lines 162. Lines 162 comprise eight lines, one for each of the data bits ZDQ15 through ZDQ8. Each of the eight lines 162 is coupled to all the flash EPROMs 81, 83, 85, 87, 89, 91, 93, 95, 97, and 99.

Data bits ZDQ7 through ZDQ0 (also collectively referred to as ZDQ (7:0)) are sent to and from card control logic 150 and flash EPROMs 80, 82, 84, 86, 88, 90, 92, 94, 96, and 98 via lines 163. Lines 163 comprise eight lines, one for each of the data bits ZDQ7 through ZDQ0. Each of the lines 163 is coupled to all the flash EPROMs 80, 82, 84, 86, 88, 90, 92, 94, 96, and 98.

Card control logic 150 sends a write enable signal ZWE# to each of the flash EPROMs 80-99 via line 164. The WE# inputs of all the flash EPROMs 80-99 are tied to the single common line 164 carrying, the ZWE# signal.

Card control logic 150 sends an output enable signal ZOE# to each of flash EPROMs 80-99 via line 166. The OE# inputs of all the flash EPROMs 80-99 are tied to the single common line 166 carrying the ZOE# signal.

Card control logic 150 receives ready/busy RY/BY# signals from flash EPROMs 80-99 via lines 168. There are twenty lines 168, one for each RY/BY# output of each flash EPROMs 80-99. The twenty RY/BY# signals on lines 168 are collectively referred to as ZRY/BY# or ZRY/BY# (19:0).

Card control logic sends out a power down signals PWD# to each of the flash EPROMs 80-99 via lines 70. There are ten lines 70, each line going to the PWD# inputs of a respective zone pair of flash EPROMs. For example, one of the lines 70 is connected to the PWD# pins of flash EPROMs 80 and 81. The ten ZPWD# signals on lines 70 are collectively referred to as ZPWD# or ZPWD# (9:0).

Address bits ZA19 through ZA0 (also collectively referred to as ZA(19:0)) are sent from card control logic 150 to flash EPROMs 80-99 via lines 72. Lines 72 comprise twenty lines, one for each of the address bits ZA19 through ZA0. Each of the twenty lines 74 carrying bits ZA (19:0) is coupled to all of the flash EPROMs 80-99.

Chip enable signals ZCE# are sent on lines 74 to each of the flash EPROMs 80-99. There are twenty lines 74, one for each of the flash EPROMs 80-99. The twenty ZCE# signals on lines 74 are collectively referred to as ZCE# or ZCE# (19:0).

Circuitry 140 includes ground circuitry 156 that grounds outputs CD1# and CD2#.

FIG. 6 is a block diagram of card control logic 150 of flash memory card 110. Card control logic 150 receives addresses, data, control signals, power, and ground. Card control logic 150 in turn (1) oversees reading, erasing, and programming with respect to flash EPROMs 80-99, (2) oversees the use of electrical power within flash memory card 110, (3) oversees the sending out of host computer 101 data of the card information structure with respect to flash memory data of card 110, and (4) oversees the sending out to host computer 101 status information regarding flash memory card 110.

Card control logic 150 includes application-specific integrated circuit ("ASIC") 321, ASIC 322, and power on reset circuitry 352.

ASIC 321 includes attribute memory plane 210. Attribute memory plane 210 includes component management registers 111 and hardwired card information structure ("hardwired CIS") 240. Attribute memory plan 210 also includes reserved locations 1 31 and 139 that are not presently used.

Component management registers 111 are used to provide control and report status with respect to flash memory card 110. As discussed in more detail below, host computer 101 can read the contents of component management registers 111 if the proper inputs are applied to card control logic 150. In addition, several ones of the component managers 111 can be written to by host computer 101 if host computer 101 applies the proper input signals to card control logic 150. The addresses of attribute memory plane 210 are all even byte addresses.

Hardwired card information structure 240 contains information describing the structure of flash memory card 110. Hardwired card information structure 240 resides within attribute memory plane 210 at even byte locations starting with address 0000 hexidecimal ("HEX" or "H") and ending up at a card information structure ending tuple (namely, FNULL) within attribute memory plane 210.

The data included within hardwired card information structure 240 consists of tuples. The tuples comprise a variable-length chain of data blocks that describe details of flash memory card 110. The details that are included in the tuples include the name of the manufacturer of the particular flash memory card 110, the size of the common memory plane 145 of flash memory card 110, the type of flash EPROMs 80-99, and the number of flash EPROMs 80-99. Hardwired card information structure 240 is also referred to as embedded card information structure 240 or embedded CIS 240. The hardwired card information structure 240 is read by host computer 101.

In an alternative embodiment of the present invention, additional data that identifies the structure of flash memory card 110 is stored in a podion of a first block pair of common memory plane 145. That portion storing the additional data is referred to as an attribute block. For that alternative embodiment, card information structure is found both in the hardwired card information structure 240 and in the attribute block within the first block pair of common memory plane 145.

For one preferred embodiment of the present invention, hardwired card information structure 240 consists of combinatorial logic circuits that, in effect, simulate a read only memory. Addresses sent to hardwired card information structure 240 by personal computer 101 are decoded by the combinatorial logic circuit of hardwired card information structure 240. For a particular address input to the hardwired card information structure 240 logic circuitry, that logic circuitry provides a specific output for that particular address. In this way, hardwired card information structure 240 acts as if it were a read only memory. Given that hardwired card information structure 240 consists of hardwired logic circuitry, hardwired card information structure 240 cannot be erased or reprogrammed by host computer 101.

It is to be appreciated that the logic design for hardwired card information structure 240 follows from the addresses and tuples to be stored within hardwired card information structure 240.

Application-specific integrated circuit 321 receives address bits A8 through A0 on line 332. Address bits A8 through A0 are a subset of address bits A24 through A0 provided to card control circuitry 150 from host computer 101 on lines 303.

Application-specific integrated circuit 321 receives and sends out data bits DQ15 through DQ0 on lines 301.

Lines 301 are coupled to personal computer 101, which sends and receives data bits DQ15 through DQ0.

As described in more detail below, data bits DQ (15:0) can include data to be sent to common memory plane 145 as ZDQ (15:8) and ZDQ (7:0) via lines 162 and 163. Data bits DQ (15:0) can include data bits ZDQ (15:8) and ZDQ (7:0) from lines 162 and 163.

Data bits DQ7 through DQ0 on lines 301 can be data read from attribute memory plane 210 if the proper inputs are applied to card control logic 150 by host computer 101. In certain circumstances, data bits DQ7 through DQ0 on lines 301 comprise data to be written to certain ones of component management registers 111 of attribute memory plane 210.

ASIC 321 receives the write enable signal WE# on pin 15 from personal computer 101. ASIC 321 in turn generates the zone write enable signal ZWE#, which is sent to flash EPROMs 80–99 on line 164.

Application-specific integrated circuit 321 receives output enable signal OE# on pin 9 from personal computer 101. Application-specific integrated 321 in turn generates zone output enable signal ZOE#, which is sent to flash EPROMs 80–99 via line 166.

$V_{CC}$ and ground are also applied to ASICs 321 and 322.

Application-specific integrated circuit 321 receives zone ready/busy bits ZRY/ZBY#(19:0) on lines 168 from the ready/busy output of each of flash EPROMs 80–99. As described in more detail below, application-specific integrated circuit 321 in turn generates a ready/busy signal RDY/BSY# that is sent from pin 16 to personal computer 101.

Application-specific integrated circuit 322 receives address bits A24 through A0 (collectively "A(24:0)") on lines 303 from personal computer 101. Application-specific integrated circuit 322 in turn generates zone address bits ZA(19:0) that ASIC 322 sends to flash EPROMs 80–99 on line 72. ASIC 322 performs address buffering for card control circuitry 150.

ASIC 322 also in turn generates zone chip enable signals ZCE# (19:0) that are sent to flash EPROMs 80–99 on lines 74.

ASICs 321 and 322 receive card enable signals CE1# and CE2# on pins 7 and 42, respectively, from host computer 101.

ASIC 322 performs a power-on reset using circuitry 352. A power on reset occurs when flash memory card 110 goes from a state of having no power applied to flash memory card 110 to a state wherein the power supply voltage $V_{CC}$ of five volts is applied to flash memory 110. Upon power on reset, various circuitry of flash memory card 110 is reset, including component management registers 111.

ASIC 322 also receives "soft" reset signal RST from host computer 101 via pin 58. ASIC 322 and ASIC 321 reset various circuits of flash memory card 110 in response to soft reset signal RST.

ASIC 322 receives register select signal REG# on pin 61 from host computer 101.

ASIC 322 generates battery voltage detect signals BVD1# and BVD2# that are sent to host computer 101 via lines 63 and 62, respectively. For one embodiment of the present invention, flash memory card 110 does not require a battery, so ASIC 322 ties both signals BVD1# and BVD2# to a logical high state at all times. For an alternative embodiment of the present invention, however, battery voltage detect signals BVD1# and BVD2# reflect the condition of a battery of flash memory card 110.

ASIC 322 provides a logical high extend bus cycle WAIT# output on pin 59 that is sent to host computer 101.

For an alternative embodiment, a logical low WAIT# output on pin 59 would be asserted by flash memory card 110 to delay completion of a memory access or an input/output access cycle then in progress.

For yet another alternative embodiment, flash memory card 110 would assert a logical low WAIT# output for approximately 750 nanoseconds (i.e., approximately 5 wait states) while flash EPROMs 80–99 recover from the power down mode. This would help to minimize the intelligence required of host computer 101 with respect to waiting.

For the embodiment shown in FIG. 6, ASIC 322 also receives the state of write protect switch 116. An output on pin 33 indicates the on or off condition of write protect switch 116.

ASIC 322 also receives card size jumpers IS2, IS1, and IS0 on lines 362, 361, and 360, respectively. Card size jumpers IS2, IS1, and IS0 are traces at the printed circuit board level of flash memory card 110 that are coupled to either five volts (a logic high) or ground (a logic low). The card size jumpers IS0, IS1, and IS2 are also collectively referred to as IS (0:2). For one embodiment of the present invention, each of the eight combinatorial states of the card size jumpers IS2, IS1, and IS0 represents a different size of common memory plane 145. This state of bits IS2, IS1, and IS0 indicates whether common memory plane 145 is two megabytes, four megabytes, six megabytes, eight megabytes, ten megabytes, twelve megabytes, sixteen megabytes, or twenty megabytes in size.

The state of card size jumper bits IS2, IS1, and IS0 is sent to ASIC 321. ASIC 321 uses the state of card size jumpers IS2, IS1, and IS0 to generate a zone present signal to reduce power consumption. The state of card size jumpers IS2, IS1, and IS0 is also applied as an input to hardwired card information structure circuitry 240, which uses the card size jumper information to determine the size of common memory plane 145.

ASIC 322 also receives as an input card speed jumper IB0 on line 365. Card speed jumper IB0 is a trace on a printed circuit board of flash memory card 110. Card speed jumper IB0 is either coupled to five volts $V_{CC}$ (a logic high) or ground (a logic low). The state of card speed jumper IB0 is applied to hardwired card information structure circuitry 240.

The logic circuitry of hardwired card information structure 240 reads the card speed bit IB0 to determine the access time of flash memory card 110. A logic high card speed jumper bit IB0 indicates an access time for flash memory card 110 of approximately 200 nanoseconds. A logic low card speed jumper bit IB0 indicates an access time for flash memory card 110 of approximately 250 nanoseconds.

ASIC 322 also receives the state of an EEPROM jumper on line 367. The EEPROM jumper coupled to line 367 is a trace on a printed circuit board of flash memory card 110. A logic high state of the EEPROM jumper coupled to line 887 indicates that an additional EEPROM 854 resides within flash memory/card 110 and is coupled to Aa10 822 via lines 855. A logic low signal on line 887 for EEPROM jumper indicates that no EEPROM 854 is present on flash memory card 110. For one embodiment of the present invention, however, there is no EEPROM 854 present on flash memory card I 10 and EEPROM jumper 887 is tied to a logic low state.

For an alternative embodiment, however, EEPROM jumper 887 is logically high and an EEPROM 854 is present. EEPROM 854 is used in that alternative embodiment to store additional card information structure information beyond that contained in hardwired card information structure circuitry 240.

ASIC 322 sends signals AV0 and AV1 to ASIC 321 via lines 338 and 336, respectively. As described in more detail below, signals AV0 and AV1 are used to choose one of four states with respect to the accessing of attribute memory plane 210 and common memory plane 145.

IRST21 is a reset signal sent from ASIC 322 to ASIC 321 via line 340. Signal IRST12 is a reset signal sent from ASIC 321 to ASIC 322 via line 342.

The all zones chip enable signal AZCE is sent from ASIC 321 to ASIC 322 via line 341. When a logical low AZCE signal is sent from ASIC 321 to ASIC 322, logic circuitry (not shown) within ASIC 322 causes logical low ZCE#(19:0) signals to be sent via lines 74 to each of the flash memory chips 80-99 concurrently. The logical low ZCE#(19:0) signals in turn cause each of the flash memories 80-99 to be in the active mode at the same time.

For an alternative embodiment, card control circuitry 150 additionally includes timer circuitry (not shown) that monitors the time elapsed since the last read, program, or erase activity with respect to any of flash EPROMs 80-99. If more than a present amount of time has elapsed, then the timer circuitry sends out control signals that place flash EPROMs 80-99 into the power down mode.

FIG. 7 shows memory map 432 of attribute memory plane 210. Attribute memory plane 210 uses only even byte addressing, so only even hexadecimal addresses are used with respect to attribute memory plane 210.

Hardwired card information structure 240 begins at address 00000 hexadecimal. Component management registers 111 begin at address 0004000 hexadecimal.

FIG. 7 also illustrates memory map 430 that lists the hexadecimal addresses and address ranges for component management registers 111. Each of the addresses is an even address. The component management registers 111 consist of configuration option register 450, configuration and status register 451, pin replacement register 452, socket and copy register 453, card status register 455, write protection register 457, power control register 459, zone ready/busy mask register 461, zone ready/busy status register 463, ready/busy mode register 465, and all zones chip enable CE# register 467. Component management registers 111 also include reserved areas 454, 456, 458, 460, 462, 464, 466, and 468.

For one embodiment of the present invention, all zeroes are stored in socket and copy register 453 and pin replacement register 452.

FIG. 8 illustrates data access mode truth table 500 with respect to flash memory card 110.

Host computer 101 writes to and reads from common memory plane 145 and attribute memory plane 210 according to the rules of truth table 500.

For a write operation, truth table 500 assumes that write protect switch 116 is not set at a write protect setting and, thus, that WP is logically low. For a write operation, truth table 500 also assumes that the SRESET bit of configuration option register 450 is logically low. The top half 510 of data access mode truth table 500 sets forth a data access mode truth table with respect to the accessing of common memory plane 145. For a write operation with respect to common memory plane 145, truth table 510 also assumes that both the CMWP and ATRWP bits (i.e., bits one and zero) of write protection register 457 are logically zero. Write protection register 457 is described in more detail below. The bottom half 512 of truth table 500 sets forth a data access mode truth table with respect to attribute memory plane 210 of flash memory card 110.

In table 500, an "H" indicates a logical high signal, an "L" indicates a logical low signal, and an "X" indicates a "don't care" condition.

ASICs 321 and 322 of card control logic 150 include circuitry for controlling the accessing of common memory plane 145 and attribute memory plane 210. Based upon inputs, the circuitry of ASIC 321 and 322 determines whether data can be read from or written to common memory plane 145 or attribute memory plane 210. In certain situations, data cannot be read from or written to either common memory plane 145 or attribute memory plane 210. ASICs 321 and 322 make their accessing decisions according the logic set forth in data access mode truth table 500 of FIG. 8 together with the state of write protect switch 116.

ASICs 321 and 322 also determine the type of addressing (i.e., word wide, byte wide, and odd byte) based upon inputs.

ASIC 321 and 322 make data access mode decisions based on the states of register select input REG# from pin 61, card enable signals CE1# and CE2# on pins 7 and 42, address bit A0 on lines 303, output enable signal OE# on pin 9, write enable signal WE# on pin 15, program/erase power supply voltages $V_{pp1}$ and $V_{pp2}$ on pins 18 and 52, write protect switch 116, and the CMWP and ATRWP bits.

Data access mode truth table 500 also sets forth the state of data bits DQ15 through DQ8 and data bits DQ7 through DQ0.

As shown in truth table 500, a logically high register select signal REG# on pin 61 allows the accessing of common memory plane 145 (assuming the other relevant input signals are proper). On the other hand, a logically low REG# signal permits the accessing of attribute memory plane 210 (assuming the other relevant input signals are proper).

Truth table 51 0 shows the required states of the REG#, CE2#, CE1#, A0, OE#, WE#, $V_{pp2}$, and $V_{pp1}$ inputs with respect to the standby mode, the byte read mode, the word read mode, the odd byte read mode, the byte write mode, the word write write mode, and the odd byte write mode with respect to common memory plane 145.

Data access mode truth table shows that when the CE1# and CE2# inputs are both logically high, the standby mode is triggered for all the flash EPROMs of common memory plane 145.

Truth table 512 sets forth the required states of REG#, CE2#, CE1#, A0, OE#, WE#, $V_{pp2}$, and $V_{pp1}$ inputs with respect to the byte read mode, word read mode, odd byte read mode, byte write mode, word write mode, and odd byte write modes with respect to attribute memory plane 210.

The multiplexing of address bit A0 and CE1# and CE2# inputs allows an eight bit host computer to access all data via data bits DQ0 through DQ7.

As shown in truth table 512, certain combinations of inputs yield invalid operations or invalid data with respect to attribute memory plane 210. Odd byte data is not valid during an access to attribute memory plane 210.

The portions of truth table 500 that indicate that a write operation is permitted only apply with respect to the portions of common memory plane 145 and attribute memory plane 210 that can be written to. For example, hardwired card information structure 240 cannot be written to by host personal computer 101. As another example, card status register 455 of component management registers 111 is a read only register that cannot be written to.

If write protect switch 116 is set to the write protect setting causing WP to be logically high, then neither common memory 145 nor attribute memory plane 210 can be written to.

FIG. 9 shows bit map 600 of zone ready/busy mask register 461, which is one of the component management registers 111 of attribute memory plane 210. Zone ready/busy mask register 461 can be written to or read from. Bit map 600 shows the correlation among (1) the bits stored in zone ready/busy mask register 461, (2) the addresses of attribute memory plane 210, and (3) the zones of flash EPROMs 80-99 of common memory plane 145.

Zone ready/busy mask register 461 is used to mask out particular ones (or none) of the zone ready/busy signals ZRY/ZBY# (19:0) received by ASIC 321 on lines 168 from flash EPROMs 80-99 on lines 168. If a logical one is stored in a particular zone ready/busy bit of zone ready/busy mask register, then the zone ready/busy signal received from that particular zone is masked. If, on the other hand, a logical zero is stored in particular zone bit location of zone ready/busy mask register 461, then the zone ready/busy signal from that particular zone is not masked.

The masking of a particular zone ready/busy bit prevents that particular zone ready/busy signal from having any effect on (1) the ready/busy output that appears on RDY/BSY# pin 16 of flash memory card 110 and also (2) card status register 455. The bits of zone ready/busy mask register 461 together with the zone ready/busy signals ZRY/ZBY# (19:0) are applied as inputs to logic circuitry of application-specific integrated circuit 321. The output of that logic circuitry is applied to pin 16 of flash memory card 110 in the form of the ready/busy signal RDY/BSY#. If a particular zone ready/busy mask bit is set to a logic one value (which is the masked condition), then that particular flash EPROM zone ready/busy signal will have no effect on the ready/busy output RDY/BSY# on pin 16. If all the zone ready/busy mask bits of zone ready/busy mask 461 are set to a logic one, which is the masked condition, then the ready/busy output RDY/BSY# on pin 16 will be set to a ready logic high value regardless of the ready or busy state of any of flash EPROMs 80-99 of common memory plane 145.

Bit map 600 of FIG. 9 shows how zone ready/busy mask register 461 stores logical one and logical zero mask values with respect to the respective RY/BY# outputs 280-299 (shown in FIGS. 5A-5C) of flash EPROMs 80-99. For example, bit 3 for address 4126 hexadecimal represents the logical mask value for ready/busy RY/BY# output 282 for flash EPROM 99 (i.e., zone 19). In other words, bits 0 through 7 for address 4122 hexadecimal, bits 0 through 7 for address 4124 hexadecimal, and bits 0 through 3 for address 4126 hexadecimal are the respective mask bits for ready/busy outputs RY/BY# 280-299 of flash EPROMs 80-99. Bits 4 through 7 for address 4126 hexadecimal are reserved for future use.

The bits of zone ready/busy mask register 461 are set to a logic one or cleared to logic zero by host computer 101. To be able to write to zone ready/busy mask register 461, host computer 101 needs to satisfy the data access mode conditions that are set forth in table 512 shown in FIG. 8.

Host computer 101 can also read the state of the bits of zone ready/busy mask register 461 by meeting the requirements of table 512 of FIG. 8.

FIG. 10 sets forth bit map 650 of ready/busy mode register 465, which is one of the component management registers 111. Ready/busy mode register 465 can be written to and read by host computer 101 if the requirements of table 512 of FIG. 8 are satisfied. Bit map 650 shown in FIG. 10 shows the correlation between (1) the bits stored in ready/busy mode register 465 and (2) address 4140 hexadecimal of attribute memory plane 210.

Ready/busy mode register 465 is used for choosing one of two modes for using unmasked zone ready/busy signals—namely, a "logical AND" mode or an "edge-triggered" mode. The mode chosen by the host computer 101 by using ready/busy mode register 465 determines what logic governs the generation of flash memory card 110 ready/busy signal RDY/BSY# that appears as an output on pin 16.

To enter the "logical AND" mode, host computer 101 clears bit zero at address 4140 hexadecimal to a logical zero in attribute memory plane 210. Bit zero at address 4140 hexadecimal is also referred to as bit RM00. The logic circuitry of ASIC 321 reads bit zero (i.e., bit RM00) and determines that the "logical AND" mode is to be entered. When bit RM00 is cleared to a logical zero, the state of bit one at address 4140 hexadecimal is a "don't" care" condition. Bit one at address 4140 hexadecimal is also referred to as bit RM01. In other words, as long as bit RM00 is a logic zero, bit RM01 can either be a logic zero or a logic one.

If the logical AND condition is chosen by clearing the RM00 bit to a logic zero, then the ready/busy output F1DY/BSY# on pin 16 will provide a ready output signal (i.e., a logical high output signal) only if all the unmasked zone ready/busy signals ZRY/ZBY# are ready (i.e., logically high). In other words, for the "logical AND" mode, any unmasked zone ready/busy signal ZRY/ZBY# going logically low pulls the flash memory card ready/busy output RDY/BSY# on pin 16 to a logical low state, which indicates a busy condition to the outside world. Thus, for the "logical AND" mode, all the unmasked zone ready/busy signals ZRY/ZBY# appear to be logically ANDed. In other words, all the unmasked zone ready/busy signal ZRY/ZBY# need to be in the ready state for a ready signal to appear on pin 16 of flash memory card 110.

The "edge-triggered" mode is entered by writing a logic one for bit RM00 together with a logic zero for bit RM01. ASIC 321 reads the logic one in bit RM00 and the logic zero in bit RM01 and then enters the edge-triggered mode. If the edge-triggered mode has been entered, then if any unmasked zone ready/busy signal ZRY/ZBY# goes from a busy state (i.e., a logical low value) to a ready state (i.e., a logical high value), ASIC 321 latches a ready signal (i.e., a logical high signal).

ASIC 321 then provides this latched ready signal as the flash memory card ready/busy output signal RDY/BSY# on pin 16. Thus, the edge-triggered mode provides an edge-triggered ready acknowledgement with respect to the zone ready/busy signals ZRY/ZBY#. For the edge-triggered mode, a ready signal on pin 16 indicates that at least one unmasked zone ready/busy signal ZRY/ZBY# has become ready.

Once the edge-triggered mode has been entered, the latch holding the ready/busy information must be cleared after each busy-to-ready transition so that a subsequent transition may be stored in the latch and in turn provided as an output on pin 16. Thus, over time the latch generally needs to be repeatedly cleared. If the edge-triggered mode has been entered the edge-triggered mode latch is cleared by setting both bits RM01 and RM00 to a logical one value. When RM01 and RM00 are each set to a logic one, ASIC 321 clears the edge-triggered latch. Clearing the edge-triggered latch allows the latch to sense the next transition by the unmasked zone ready/busy signals ZRY/ZBY# from a busy state to a ready state.

When power is initially applied to flash memory card 110, ASIC 321 and 322 clear both bits RM01 and RM00 to logic zero states. This causes flash memory card 110 to enter the "logical AND" mode. To enter the "edge-triggered" mode, host computer 101 accesses ready/busy mode register 465 and writes a logic one for bit RM00 and a logic zero for bit RM01. A software algorithm executed by host computer 101 causes host computer 101 to set bit RM01 to a logic one and bit RM00 to a logic one each time the edge-triggered latch needs to be cleared.

For an alternative embodiment of the present invention, card control logic 150 includes circuitry for clearing the edge-triggered latch when necessary once the edge-triggered mode has been entered.

FIG. 11 shows bit map 675 of zone ready/busy status register 463. Zone ready/busy status register 463 appears at addresses 4130 hexadecimal, 4132 hexadecimal, and 4134 hexadecimal of attribute memory plane 210. Each address of zone ready/busy status register references bits zero through seven. The zone ready/busy bits in zone ready/busy status register 463 reflect the state of all the zone ready/busy signals ZRY/ZBY# (19:0) appearing on lines 168. In other words, the zone ready/busy bits of zone ready/busy status register 463 reflect the state of the the ready/busy outputs RY/BY# 280–299 of flash EPROMs 80–99.

If a zone ready/busy status bit of zone ready/busy status register 463 is a logic one, this indicates that the particular flash EPROM is sending out a ready signal. If the zone ready/busy status bit is a logic zero, this indicates that the particular flash EPROM is sending out a zone busy signal.

The zone ready/busy status register 463 is a read-only register. Host computer 101 can access the zone ready/busy status register by complying with the read conditions set forth in table 512 of FIG. 8.

For example, bit four at address 4130 hexadecimal of zone ready/busy status register 463 indicates the state of the ready/busy output RY/BY# 284 of flash EPROM 84 (i.e., zone 4).

Zone ready/busy status register 463 of FIG. 11 is not to be confused with zone ready/busy mask register 461 of FIG. 9. The zone ready/busy status bits of zone ready/busy status register 463 of FIG. 11 are neither masked nor unmasked bits. Rather, they reflect the state of the zone ready/busy signals ZRY/ZRY# (19:0) before those signals are in any way affected by the zone ready/busy mask bits of zone ready/busy mask register 461 of FIG. 9.

As shown in FIG. 11, bits 4 through 7 at address 4134 hexadecimal of zone ready/busy status register 463 are reserved bits.

FIG. 12 illustrates bit map 700 of power control register 459. Power control register 459 manages power consumption of flash memory card 110. Power control register 459 allows the selection of (1) which flash EPROM zone pairs are to be placed into the active mode or the standby mode and (2) which flash EPROM zone pairs are to be placed into the power down mode.

As described above, when one of the flash EPROMs 80–99 is in the power down mode, that flash EPROM consumes a smaller amount of power than that flash EPROM consumes in the standby mode or in the active mode.

A logical one in any assigned bit of power control register 134 will allow the respective zone pair to either be in active mode or the standby mode. A logical zero in any assigned bit of power control register 134 will put the respective flash EPROM zone pair in the power down mode. The power down mode overrides both the active mode and the standby mode for a flash EPROM.

Bit map 700 sets forth the correlation among the addresses, bits, and zone pairs with respect to power control register 459. For example, bit zero for address 4118 hexadecimal is assigned to zones zero and one, which correspond to flash EPROMs 80 and 81. Bits seven through two at address 411A hexadecimal are reserved.

Power control register 459 is a read/write register. The host computer can read from or write to power control register 459 by satisfying the conditions set forth in data access truth table 512 of FIG. 8. Host computer 101 can place pairs of flash EPROMs 80–99 into the power down mode by writing to power control register 459 and setting the bits of power control register 459 to the proper state.

The output from power control register 459 corresponds to the state of the bits corresponding to zones 19 through 0. The output of power control register 459 is applied to zone pairs of flash EPROMs 80–99 under the control of ASIC 321 via lines 70 as zone power down signals ZPWD# (9:0).

FIG. 13 shows bit map 725 of configuration and status register 451. Configuration and status register 451 is a read/write register that can be read from and written to by host computer 101 if host computer 101 follows the requirements set forth in table 512 of FIG. 8.

As shown in FIG. 13, configuration and status register 451 is located at address 4002 hexadecimal in attribute memory plane 210. Bit two of configuration and status register 451 controls a global power down for flash memory card 110. Bit two of configuration and status register 451 is also referred to as the PWRDWN bit.

If a logical one is written to the PWRDWN bit two, then ASIC 321 sends logical low zone power down signals ZPWD# (9:0) on lines 70 to all the zone pairs of flash EPROMs 80–99 in order to place flash EPROMs 80–99 all into the power down mode. Host computer 101 can write a logic one to bit two of configuration status register 451 if the conditions set forth in table 512 of FIG. 8 are met.

For one embodiment of the present invention, host computer 101 should not, however, place flash EPROMs 80-99 into the power down state while the ready/busy signal RDY/BSY# on pin 16 indicates a busy (i.e., logic low) state.

ASIC 321 is configured such that the contents of power control register 459 (shown in FIG. 12) are retained from a time prior to when the global power down state is entered to a time after the global power down state is exited. The global power down state is exited when host computer 101 clears the PWRDWN bit to a logic zero. The contents of power control register 459 are not altered when a logical one is written to bit two of configuration and status register 451 and the global power down function is initiated. When a logical zero is then written to bit two of configuration and status register 451, the contents of power control register 459 are retained. Therefore, after a logic zero is written to the PWRDWN bit of configuration status register 451, the retained contents of power control register 459 then govern which zone pairs remain in the power down mode or return to active or standby modes. In other words, after the global power down mode is exited, the power control register 459 then controls which zone pairs of flash EPROMs 80-99 are to be left in the power down mode. ASIC 321 ensures that the contents of power control register 459 are saved during the time that a global power down occurs.

For one embodiment of the present invention, bits 7 through 3 and bits 1 and 0 of configuration and status register 451 store logic zeroes.

FIG. 14 shows bit map 750 of write protection register 457 located at address 4104 hexadecimal. Write protection register 457 is a read/write register that can be read from and written to by host computer 101 if host computer 101 meets the requirements of table 512 of FIG. 8 with respect to data access. Write protection register 457 helps to avoid accidental data corruption.

For one alternative embodiment of the present invention, a software attribute block is included within zone pair zero of common memory plane 145. That attribute data block is used to store additional card information structure ("CIS") information—i.e., CIS information beyond the CIS information already stored in hard-wired card information structure 240. The attribute block in common memory plane 145 is not to be confused with attribute memory plane 210.

If a logical one is written to bit zero at address 4104 hexadecimal of write protection register 457, then that alternative embodiment attribute block in common memory plane 145 is write protected. Bit zero of write protection register 457 is also referred to as the ATRWP bit. If, on the other hand, the ATRWP bit is a logic zero, then the attribute block within common memory plane 145 is not write protected.

If a logic one is written to bit one of write protection register 457, then the remaining blocks of common memory plane 145 besides the attribute block are write protected. Bit one of write protection register 457 is also referred to as the CMWP bit. On the other hand, if a logic zero is written to bit one of write protection register 157, then the remaining blocks of common memory plane 145 are not write protected.

The power-on default state for the CMWP and ATRWP bits (i.e., bits one and zero) of write protection register 457 is a logic zero state. Bits 7 through 2 of write protection register 457 are reserved for future use.

FIG. 15 shows bit map 775 of configuration option register 450 located at address 4000 hexadecimal. Configuration option register 450 is a read/write register that can be read from and written to by host computer 101 if host computer 101 satisfies the requirements of table 512 of FIG. 8.

Bit seven of configuration option register 450 is the soft reset bit, which is also referred to as the SRESET bit. Writing a logic one to the SRESET bit resets flash memory card 110 to the power on default state. thus, configuration option register 450 permits a reset that is controlled by the software of host computer 101. When the SRESET bit is a logic one, all the component management registers 111 besides configuration option register 450 are cleared to zeroes. Moreover, when the SRESET bit is a logic one, logic low ZPWD#(9:0) signals are sent to flash EPROMs 80-99, placing all the flash EPROMs in common memory plane 145 into the power down mode. Attribute memory plane 210 is readable, however, while the SRESET bit is a logic one.

The SRESET bit must be cleared to a logic zero in order to write to (1) common memory plane 145 and (2) component management registers 111 other than configuration option register 775.

The SRESET bit clears to a logic zero at the end of a power on reset cycle or a system reset cycle.

Bits 6 through 0 of configuration option register 450 are all logic zeroes.

FIG. 16 is a bit map 800 of card status register 455 located at address 4100 hexadecimal. Card status register 455 is a read only register that cannot be written to. Card status register 455 can be read by host computer 101 if the requirements of table 512 of FIG. 8 are satisfied.

Bit zero of card status register 450 reports the state of the ready/busy output RDY/BSY# for flash memory card 110. Bit zero of card status register 450 thus mirrors the state of pin 16 of flash memory card 110.

Bit one of card status register 455 reports the state of write protect switch 116 of flash memory card 110. Bit one thus mirrors the state of output pin 33 of flash memory card 110.

Bit two of card status register 455 reports the state of the ATRWP bit of write protection register 457.

Bit three of card status register 455 reports the state of the PWRDWN bit of configuration and status register 451.

Bit four of status card register 455 reports the state of the CMWP bit of write protection register 457.

Bit five of card status register 455 reports the state of the SRESET bit of configuration option register 450.

Bit six of card status register 455 is the any zone power down bit ANYZPWD. The state of the ANYZPWD bit indicates whether or not any pair of flash EPROM zones of common memory plane 145 is in the power down state.

Bit seven of card status register 455 is the any zone mask bit ANYZMSK. The state of the ANYZMSK bit indicates whether any flash EPROM of common memory plane 145 has its zone ready/busy ZRY/ZBY# output signal masked.

With respect to FIGS. 7-16, it is to be appreciated that individual bits of power control register 459 control individual flash EPROMs, allowing any combination of active and powered down devices. Thus, several active flash EPROM groups can be enabled for different simultaneous read, write, and erase operations while all other flash EPROMs are in a power down mode.

Zone ready/busy mask register 4.61 and ready/busy mode register 465 provide ready/busy masking for individual devices. Any grouping of the flash EPROMs ready/busy outputs can be provided to host computer 101 for tracking of any size grouping of erasure or write operations. An example of a grouping is for multiple flash EPROM interleaved writes for improved performance.

The ready/busy masking modes (i.e., "logical AND" and "edge-triggered") also allow isolation of flash EPROMs or flash EPROMs groupings with respect to operation type, specifically erase versus write. The masking of write-related ready/busy signals from affected flash EPROMs allows them to be serviced faster than if their ready/busy output signals were OR tied with a larger device group that included erasing devices. In an OR tied situation, the longer erase operations would override the faster write ready/busy timing intervals.

In addition to interleaving or function type segregation, the ready/busy masking modes allow isolation of flash EPROM or flash EPROM groups with respect to differences in their individual erase or write performance. This allows flash EPROM groupings where flash EPROM to flash EPROM performance differences are not screened or are not actively managed.

For example, if the flash EPROMs come from different fabrication lots, there will be performance differences. Lack of active management means that the block to block erase/rewrite cycles of the flash EPROMs are not kept uniform by the flash memory card file structure. The capability to segregate faster erasing or writing devices from slower ones in multiple flash EPROM write operations can be used to maximize overall system performance.

For an alternative embodiment of the present invention, power control register 459 and the zone ready/busy mask register 461 are variable in size. For that alternative embodiment, they have bits for controlling device pairs or any device grouping. The number of bits required varies with the total number of such control groups in relationship to the total number of flash EPROMs in flash memory card 110.

For another alternative embodiment, the functions of zone ready/busy mask register 461, ready/busy mode register 465, and power control register 459 are combined to provide automatic wake up or automatic waiting for an ongoing erase or write operation to complete. Automatic wake up means resetting power control register 459 to active. Automatic waiting for ongoing erase or write operations to complete entails monitoring flash EPROM ready/busy status. For that alternative embodiment, the appropriate system ready/wait output could be generated to synchronize host system 101 bus read or write cycles.

FIG. 17 shows bit map 801 relevant to all zones chip enable register 467. All zones chip enable register is a write-only register.

For one embodiment of the invention, all zones chip enable register 467 does not exist as an actual physical "register" from which one can read data bits. Instead, all zones chip enable "register" 467 comprises logic circuitry and latches within ASIC 321. That all zones chip enable circuitry emulates a register that is written to (but cannot be read from). Therefore, all zones chip enable register 467 is also referred to as all zones chip enable circuitry 467.

The all zones chip enable circuitry 467 can be used to generate an all zone chip enable mode signal that in turn generates logical low ZCE#(19:0) signals sent via lines 74 to each of the respective flash memory chips 80–99 concurrently. The concurrent logical low ZCE#(19:0) signals in turn place each of the respective flash memories 80–99 into the active mode concurrently. This condition is referred to as the all zones chip enable mode.

Having the flash memories 80–99 in the active mode concurrently permits the user to write to or erase flash memories 80–99 concurrently. In other word, all zones chip enable circuitry 467 allows the user of host computer 101 to write to or erase flash memories 80–99 in parallel simultaneously.

Having flash memories 80–99 in the active mode concurrently permits relatively rapid erasure and programming of flash memories 80–99. Relatively rapid erasure of flash memories 80–99 can be important, for example, for removing old data in preparation for receiving new data. Relatively rapid erasure and programming of flash memories 80–99 can be important, for example, in the testing of flash memories 80–99 of flash memory card 110.

Each of the flash EPROMs 80–99 has sixteen separate blocks that are individually erasable and programmable. When the all zones circuitry 467 sends out a logical high all zones chip enable mode signal, a particular block in each of the flash EPROMs 80–99 can then be erased or written to simultaneously given that logical low ZCE# signals sent to flash EPROMs 80–99 place flash EPROMs 80–99 in the active mode. The particular blocks written to or erased comprise equivalent blocks within flash EPROMs 80–99. For example, once a user uses all zones circuitry 467 to place flash EPROMs 80–99 in the active mode concurrently, the user may then choose to simultaneously erase the first block in each of flash memories 80–99. To entirely erase all of flash memories 80–99, the user would then erase the second blocks, the third blocks, etc., until all sixteen blocks in each of flash memories 80–99 are erased.

In order to have all zone chip enable circuitry 467 generate a logical high all zones chip enable mode signal, a user must perform the following two write operations sequentially in the proper order. First, the user must write data comprising the number D2 hexidecimal (i.e., 11010010 binary) to address 41 FE hexadecimal of attribute memory plane 210 of ASIC 321. Second, the user must then write data comprising the number 4B hexadecimal (i.e., 01001011 binary) to address 41FC hexadecimal of attribute memory plane 210. Bit map 801 in FIG. 17 shows data D2 hexadecimal at address 41FE hexadecimal and data 4B hexadecimal at address 41FC hexadecimal. Once the above two write operations are performed sequentially, all zones chip enable circuitry 467 generates a logical high all zones chip enable mode signal IAZCE. The logical high IAZCE signal is inverted and then sent from ASIC 321 to ASIC 322 as a logical low AZCE signal on line 341. Logic circuitry within ASIC 322 then generates logical low chip enable ZCE#(19:0) signals that are sent to each of the respective flash memory chips 80–99 concurrently.

The two step sequence of writing to two addresses to enter the all zones chip enable mode helps to ensure that the all zones chip enable mode is not entered inadvertently.

All zones chip enable circuitry 467 has a "clear" feature. Once a user has written the number D2 hexadecimal to address 41FE hexadecimal in attribute memory plane 210, or once the all zones chip enable mode has been entered, then all zones circuitry 467 can be cleared if the user then writes the number BD hexadecimal (i.e., 10111101 binary) to address 41FC hexadecimal in attribute memory plane 210. Clearing all zones circuitry 467 means that D2 hexadecimal must be written to address 41FE hexadecimal again and that 4B hexadecimal must be written to address 41FC for all zones chip enable circuitry 467 to trigger the all zones chip enable mode.

For one embodiment of the present invention, the power down mode can be used in conjunction with the all .zones chip enable mode in order to avoid excessive power consumption. The power down mode overrides the active mode and the standby mode for any flash EPROM of flash EPROMs 80–99. Therefore, even if all zones circuitry 467 causes logical low ZCE#(19:0) signals to be sent to respective flash EPRO Ms 80–99 concurrently, a logical low power down signal PWD# sent to a particular flash EPROM of flash EPRO Ms 80–99 will cause that flash EPROM to enter the power down mode. That flash EPROM in the power down mode cannot be erased or written to. It is to be appreciated that more than one flash EPROM can be placed into the power clown mode.

For example, a high power draw caused by erasure of all flash EPROMs 80–99 could be avoided by performing erasure in two parts. All zones chip enable circuitry 467 could be used to place all of flash EPROMs 80–99 in the active mode. Power control register 459 could then be used to place one-half of flash EPROMs 80–99 in the power down mode. The flash EPROMs not in the power down mode (i.e., one half of the flash EPROMs) could then be erased. Then the other half of the flash EPROMs could be placed in the power down mode (via power control register 459) while the remaining half of the flash EPROMs ars taken out of the power down mode and placed back into the active mode. The flash EPRO Ms not in the power down mode (i.e., one half of flash EPROMs 80–99) could then be erased.

FIGS. 18A–D, 19A–L, 20, 21A–C, 22, 23A–C, and 24 illustrate various circuitry of card control logic 150. For those figures, the prefix "I" and the prefix "R" indicate the version of a signal internal to card control logic 150. The term "IN" on the figures indicates an input. The term "OUT" on the figures indicates an output. The "#" symbol indicates a "bar" or "B" signal—i.e., an active low signal.

FIGS. 18A through 18D comprise a block diagram of application-specific integrated circuit 321 of card control logic 150. ASIC 321 includes attribute memory plane 210. Attribute memory plane 210 includes component management registers 111 and hardwired card information structure 240.

Master internal control circuitry 825 of ASIC 321 receives the following signals as inputs: card enable CE1#, card enable CE2#, write protect WP, write enable WE#, output enable input OE#, address bit A0 (from host computer 101), control input AV0, and control input AV1.

Control inputs AV0 and AV1 are received on lines 338 and 336 from ASIC 322. The combined binary state of mode bits AV0 and AV1 is a signal to ASIC 321 for ASIC 321 to go into one of four modes. The four modes are as follows: (1) accessing an optional attribute block within common memory plane 145, (2) accessing hardwired card information structure 240 within attribute memory 210, (3) accessing common memory 145 minus any optional attribute block within common memory plane 145, and (4) accessing component management registers 111 of attribute memory plane 210.

Mode bits AV0 and AV1 are generated by ASIC 322 based on address inputs A (24:0) and the REG# input to flash memory card 110. ASIC 321 uses mode bits AV0 and AV1 together with address inputs A (8:0) to access attribute memory plane 210, among other things.

Master control circuitry 825 provides overall control for ASIC 321. Master internal control circuitry 825 controls, for example, the timing and flow of data through ASIC 321. Master internal control circuitry 825 also outputs the zone write enable signal ZWE# and the zone output enable ZOE# on lines 164 and 166, respectively.

Master internal control circuitry 825 also controls slave internal control circuitry 826. Slave internal control circuitry 826 performs additional control functions for ASIC 321.

Data bits DQ (15:0) are coupled to slave internal control circuitry 826 via bus driver interface 830. Bus driver interface 830 is an interface between host computer 101 and slave internal control circuitry 826. Bus driver interface 830 controls the direction of the flow of data on lines 301.

Data bus driver interface 831 is an interface between slave internal control circuitry 826 and common memory plane 145. Data bus driver interface 831 controls the direction of the flow of data bits DQ (15:0).

Input latches 850 save power by latching various signals. Latches 850 latch address bits A8 through A0. Input latches 850 also latch signals IAV1, IAV0, CE1#, and CE2#. The outputs from input latches 850 are applied to attribute memory plane 210.

Attribute memory plane 210 also receives as inputs (1) the state of card speed jumper IBO, (2) the states of jumpers IS2, IS1, and IS0, (3) the IRST21 reset signal sent from ASIC 322, and (4) a write enable signal RWE#.

Read enable latch 852 latches output enable signal ROE# and then provides the latched signal as signal READLAT to an input of attribute memory plane 210.

ASIC 321 also receives as inputs zone reedy/busy signals ZRY/ZBY# (19:0) from common memory plane 145 via zone reedy/busy gating circuitry 875.

Outputs from attribute memory plane 210 include (1) the zone power down signals ZPWD# (9:0) on lines 70, (2) the flesh memory card ready/busy output RDY/BSY# on pin 16, and (3) the IRST12 reset signal on line 342. The IRSTI2 signal is sent to ASIC 322.

Attribute memory plane 210 also provides as outputs zone present signals ZP (1:9) and ZP (1:9)#. The zone present signals ZP (1:9) and ZP (1:9)# are control signals that are used to indicate whether a flash EPROM memory zone is present. The zone present signals ZP (1:9) and ZP (1:9)# are generated as a result of inspecting card size jumpers IS2, IS1, and IS0.

The purpose of the zone present signals is to reduce software complexity and reduce the power requirements of flash memory card 110. The zone present signals ZP (1:9) permit only those signals that are expected to be present—in view of the size of common memory plane 145—to pass through certain gates. For example, if in one embodiment of the present invention common memory plane 145 only has two flash EPROMs (rather than twenty flash EPROMs), then signals to and from those two flash EPROMs would be applied to various circuitry of ASIC 321 arid ASIC 322. The zone present control signals ZP (1:9) and ZP (1:9)# would provide control signals to gates to prevent the sending and receiving of signals within ASIC 321 and ASIC 322 with respect to any other flash EPROMs besides these two flash EPROMs because no other flash EPROMs would be present on the flash memory card 110.

The zone present signals ZP (1:9) are, for example, applied to gates of zone ready/busy gating circuit 875. The zone ready/busy gating circuit 875 gates only those zone ready/busy signals ZRY/ZBY# (19:0) that would be received from common memory plane 145 in view of the number of flash EPROMs within common memory plane 145 as reflected by the card size jumpers IS2, IS1, and IS0.

The zone ready/busy signals that are sent as outputs from zone ready/busy gating circuit 875 are applied as inputs to attribute memory plane 210.

FIGS. 19A through 19C comprise a block diagram of attribute memory plane 21 0. Attribute memory plane 21 0 includes configuration option register 450, configuration and status register 451, socket and copy register 453, write protection register 457, power control register 459, zone ready/busy mask register 461, ready/busy mode register 465, all zones chip enable logic circuitry and hardwired card information circuitry 240.

The signals ICE2#, ICE1#, IRAV1, and IRAV0 are applied as inputs to register select circuitry 890. Address bits RA [0:8] are also applied as inputs to register select circuitry 890. The inputs to register select circuitry 890 are latched in order to avoid unnecessary state transitions in order to conserve power.

Based upon the particular state of those inputs, register select circuitry 890 generates the following register select control signals that are applied as inputs to register data output multiplexer 914: RSC0, RSCAS, RSSAC, RSCS, RSWP, RSPC0, RSPC1, RSRBM0, RSRBM1, RSRBM2, RSBS0, RSRBS1, RSBS2, RSRM, RSAZ1, RSAZ0, RSECIS, and RSOZONL.

Register data output multiplexer 914 also receives data outputs from component management registers 111 and hardwired card information structure 240. Depending upon the state of the register select control signals sent from register select circuitry 890, register data output multiplexer 914 determines which of the data outputs from component management registers 111 and hardwired card information structure 240 are placed upon lines 301 as data bits DQ (7:0) to be received by host computer 101.

In short, register select circuitry 890 and register data output multiplexer 914 permits the addressing of attribute memory plane 210 pursuant to memory maps 430 and 432 shown in FIG. 7.

Register write control logic 910 is circuitry that determines whether or not a write operation is permitted for a location in attribute memory plane 210. Register write control logic 910 receives as inputs the register select signals RSC0, RSCAS, RSWP, RSPC0, RSPC1, RSRBM0, RSRBM1, RSRBM2, and RSRM generated by register select circuitry 890. Register write control logic 910 also receives as an input a RWE# signal.

Register write control logic 910 operates according to the rules of data access mode truth table 500 of FIG. 8. Register write control logic 910 generates write enable outputs RSWEC0#, RSWECAS#, RSWEWP#, RSWEPCO#, RSWEPC1#, RSWERB0#, RSWERB1#, RSWERB2, RSWERM#, and RWED# that are sent to circuitry controlling the read/write registers 461,465, 459, 451,457, and 450 and the all zones card enable CE# logic circuitry 885 shown in FIGS. 18B and 18C.

Attribute memory plane circuitry 210 includes zone present circuitry 901. As discussed above, zone present circuitry 901 generates zone present signals ZP (1:9) and ZP (1:9)# that provide an indication within ASIC 321 and ASIC 322 whether or not a signal should be present in view of the size of common memory plane 145. Zone present circuitry 901 looks to the state of card size jumpers IS2, IS1, and IS0 to determine the size of common memory plane 145. Zone present circuitry 901 helps to reduce software complexity because card control logic 150 does not have to handle flash EPROMs that are in fact not present within common memory plane 145 as flash memory card 110 is actually configured. Zone present circuitry 901 thus provides a mechanism to automatically configure card control circuitry 150 of flash memory card 110.

Attribute memory 210 includes ready/busy latch 905. Ready/busy latch 905 receives as inputs zone ready/busy signals IZRB (0:19); register select signals RSRBS2, RSRBS1, and RSRBS0; and signals IRST and READLAT. Ready/busy latch 905 helps to avoid ready/busy transitions while host computer 101 is currently reading from attribute memory plane 210. Ready/busy latch 905 helps to prevent new data from coming to attribute memory plane 210 during a read cycle. Ready/busy latch 905 provides latched zone ready/busy signals LZRB (0:19) to zone ready/busy mask register 461.

All zones chip enable ("CE#")logic circuitry 467 generates chip enables to be sent to all flash EPROMs 80-99 simultaneously. All zones CE# logic circuitry 467 permits relatively quick erasure and quick programming testing. All zones CE# logic circuitry 467 is described in more detail below.

Ready/busy latch 912 receives as inputs an IRDY/BSY output from ZRDY/BSY# mask register 461, an IRST signal, a READLAT signal, and an RSCS signal. Ready/busy latch 91 2 in turn generates latched signal LRDY/BSY based on the states of those inputs. Latched signal LRDY/BSY is then applied as an input to register data output multiplexer 91 4 to function as bit 0 of card status register 455 if address 4100 Hex of attribute memory plane 210 is chosen by the user.

For one embodiment of the present invention, card status register 455 does not exist as an actual physical register. Instead, register select circuitry 890 and register data multiplexer 914 together emulate card status register 455 according to the requirements of memory map 800 of FIG. 16. When register select circuitry 890 receives the proper ICE2#, ICE1#, IRAV1, IRAV0, and RA (0:8)inputs to indicate that location 4100 Hex of attribute memory plane 210 is being addressed, then register select circuitry 890 sends a register select signal RSCS to register data output multiplexer 914. In accordance with bit map 800 of FIG. 16, if address 4100 Hex is chosen, the register data output multiplexer 91 4 places the ANYZMSK, ANYZPWD, SRESET, CMWP, PWRDWN, ATRWP, WP, and RDY/BSY# signals onto lines 301 to be sent to host computer 101 as data bits DQ (7:0).

For one preferred embodiment of the present invention, zone ready/busy status register 463 does not exist as an actual physical register. Instead, register select circuitry 890 and register data multiplexer 914 together emulate zone ready/busy status register 463 according to the requirements of memory map 675 of FIG. 11. When register select circuitry 890 receives the proper ICE2#, ICE1#, IRAV1, IRAV0, and RA (0:8) inputs to indicate that "locations" 4130 Hex, 4132 Hex, or 4134 Hex of attribute memory plane 210 are being addressed, then register select circuitry 890 sends respective register select signals RSRBS0, RSRBS1 or RSRBS2 to register data output multiplexer 914. In accordance with bit map 657 of FIG. 11, if address 4130 Hex is chosen, then register data output multiplexer 914 places zone ready/busy bits ZRY/BY# (7:0) onto lines 301 to be sent to host computer 101 as data bits DQ (7:0). If address 4132 Hex is chosen, then register data output multiplexer 914 places zone ready/busy bits ZRY/BY# (15:8) onto lines 301 to be sent to host computer 101 as data bits DQ (7:0). If, however, address 4134 Hex is chosen, then register data output multiplexer 914 places zone ready/busy bits ZRY/BY# (19:16) onto lines 301 to be sent to host computer 301 as data bits DQ (3:0).

FIG. 20 is a circuit diagram of zone present circuit 901 that generates zone present signals ZP (1:9) and ZP (1:9)# that are used to gate other signals within card control circuitry 150 to avoid the transmission and reception of signals with respect to flash EPROMs that happen not to be present on flash memory card 110.

Zone present circuit 901 receives as inputs card size jumper IS2 on line 362, jumper IS1 on line 361, and jumper IS0 on line 360.

The zone present circuit 901 provides as outputs zone present signals ZP (1:9) and ZP (1:9)#.

FIGS. 21A through 21C comprise a circuit diagram of zone ready/busy mask register 461. Zone ready/busy mask register 461 receives as inputs latched zone ready/busy signals LZRB (19:0).

Zone ready/busy mask register 461 also receives mode bits RM0 (0:1) —which are also referred to as RM01 and RM00—from ready/busy mode register 465. Bits RM01 via RM00 are applied to logic circuit 959 and edge-triggered mode latch 960. Edge-triggered mode latch 960 is used during the "edge-triggered" mode discussed above. Logic circuit 959 is used to decide whether to enter the "edge-triggered" mode or the "logical AND" mode.

Zone ready/busy mask register 461 also receives as inputs active low zone present signals ZP (1:9)#. As shown in FIG. 20, logic circuitry is used to gate the zone present signals ZP (1:9) and the latched zone ready/zone busy signals LZRB (19:0).

Data bits DQ (0:7) are applied as inputs to latches 971 through 975 in order to generate ready/busy mask bits RBM0 through RBM19, which are collectively referred to as mask bits RBM (0:19). The mask bits RBM (0:19) from of latches 971-975 are then applied to logic circuitry shown in FIGS. 21A-21C that performs the required logic that depends on whether (1) the circuit 461 is in the "logic AND" mode, (2) the circuit 461 is in the "edge-triggered" mode, and (3) the number of flash EPROMs that are present in common memory plane 145.

Zone ready/busy mask register 461 provides a ready/busy output RDY/BSY# that is sent from flash memory card 110 to host computer 101 via pin 16.

FIG. 22 illustrates the circuitry of ready/busy mode register 465. Bit zero of ready/busy mode register is stored in latch 480. Bit one of ready/busy mode register 465 is stored in latch 481. Bits 2 through 7 of ready/busy mode register 465 are reserved.

FIGS. 23A through 23C illustrate the circuitry of power control register 459 of component management registers 111. Flip-flops 991 through 994 are used to store the power control bits with respect to the zone pairs. The output signal XANYZPWD on line 996 indicates that a zone is powered down. This XANYZPWD signal is sent to register data output multiplexer 914 to function as a bit of card status register 455. The output signal XPWRDWN on line 998 indicates that all of flash EPROMs 80–99 are powered down. The XPWRDWN signal on line 998 goes to register data output multiplexer 914 to function as a bit of card status register 455.

Zone present signals ZP(1:9) and ZP(1:9)# are used to gate the combinatorial logic within power control register 459 to minimize power consumption.

FIG. 24 is a circuit diagram of all zones chip enable logic circuitry 467. The all zones chip enable circuitry 467 is used to enter the all zones chip enable mode wherein each of flash EPROMs 80–99 are placed into the active mode concurrently.

In order to have all zone chip enable circuitry 467 send out the proper signal to place flash EPROMs 80–99 in the active mode concurrently, a user must perform the following two write operations sequentially in the proper order.

First, the user must write data comprising the number D2 hexadecimal (i.e., 11010010 binary) to address 41FE hexadecimal of attribute memory plane 210. When register select circuitry 890 receives the proper ICE2#, ICE1#, IRAV1, IRAV0, and RA (0:8)inputs to indicate that location 41FE Hex of attribute memory plane 210 is being addressed, then register select circuitry 890 sends out register select signal RSAZ0 to all zones chip enable circuitry 467. Logic circuitry 1501, 1503, and 1505 of all zones CE# circuitry 467 shown in FIG. 24 decodes the data on data bus RDI (0:7). When data D2 Hex appears on data bus RDI (0:7), logic circuitry 1501 sends a DEETWO signal to circuitry 885. Latch 1512 is set to a logical high if D2 Hex data has been sent to address 41FE Hex.

To enter the all zones chip enable mode, the user must next write data comprising the number 4B Hex to address 41FC Hex of attribute memory plane 210. When register select circuitry 890 receives the proper ICE2#, ICE1#, IRAV1, IRAV0, and RA (0:8) inputs to indicate that location 41FC Hex of attribute memory plane 210 is being addressed, then register select circuitry 890 sends out register select signal RSAZ1 to all zones chip enable circuitry 467. When data 4B Hex appears on data bus RDI (0:7), logic circuitry 1503 sends a FOURBEE signal to circuitry 885. Latch 1514 is set to a logical high if 4B Hex data has been sent to address 41FC Hex.

The setting of latch 151 4 causes a logical high all zones chip enable signal IAZCE to be sent from all zones chip enable circuitry 467 to inverter 887 shown in FIG. 18B. Inverter 887 then sends out a logical low AZCE signal, which is sent from ASIC 321 to ASIC 322 via line 341, as shown in FIG. 6.

Logic circuitry (not shown) within ASIC 322 receives the logical low AZCE signal and, upon receipt of the logical low AZCE signal, sends out concurrent logical low chip enable signals ZCE# (19:0) on lines 74 to respective flash EPROMs 80–99. The concurrent logical low ZCE# (19:0) signals in turn place each of the respective flash memories 80-99 into the active mode concurrently.

The logical high IAZCE signal indicating the occurrence of the all zones chip enable mode is also sent to master internal control circuitry 825 shown in FIG. 18A. When master internal control circuitry 825 receives the logical high IAZCE signal, master internal control circuitry 825 sends a logical high output enable signal ZOE# to each of flash EPROMs 80-99. The logical high output enable signal ZOE# prevents the gating of data from flash EPROMs 80-99. This prevents the user from reading from flash EPROMs 80-99 during the all zones chip enable mode. Nevertheless during the all zones chip enable mode, the user can erase or program flash EPROMs 80-99 that are not powered down.

All zones chip enable circuitry 467 has a "clear" feature. Once a user has written the number D2 Hex to address 41FE Hex in attribute memory plane 210, or once the all zones chip enable mode has been entered, then all zones circuitry 467 can be cleared if the user then writes the number BD Hex to address 41FC Hex in attribute memory plane 210. When register select circuitry 890 receives the proper ICE2#, ICE 1 #, IRAV1, IRAV0, and RA (0:8) inputs to indicate that location 41FC Hex of attribute memory plane 210 is being addressed, then register select circuitry 890 sends out register select signal RSAZ1 to all zones chip enable circuitry 467. When data BD Hex appears on data bus RDI (0:7), logic circuitry 1505 sends a BEEDEE signal to circuitry 885. Latch 1514 is cleared to a logical low if BD Hex data has been sent to address 41FC Hex.

When latch 1514 is cleared to a logical low value, then all zones chip enable signal IAZCE becomes logically low. A logical low IAZCE signal in turn means that the AZCE signal is logically high. The logic circuitry within ASIC 322 will not drive trigger the all zones chip enable mode if the AZCE signal is logically high. Therefore, the all zones chip enable mode will be not entered if BD Hex data is written to address 41FC Hex in attribute memory plane 210.

FIGS. 25A through 25D show tables 1001 through 1006 that set forth the addresses and data of the tuples that comprise hardwired card information structure 240. The format of the tuples is as follows:

| TUPLE FORMAT | |
|---|---|
| BYTES | DATA |
| 0 | Tuple Code: CISTPL_xxx. The tuple code 0FF Hex indicates no more tuples in the list. |
| 1 | Tuple link: TPL_LINK. Link to the next tuple in the list. This can be viewed as the number of additional bytes in the tuple, excluding this byte. If the link field is zero, the tuple body is empty. If the link field contains 0FF Hex, this tuple is the last tuple in the list. |
| 2-n | Bytes specific to this tuple. |

Tuple CISTPL_DEV=01 Hex is the Device Information Tuple. Tuple CISTPL_DEV contains information pertaining to the speed and size of flash memory card 110. Preferred access times are 200 or 250 nanoseconds.

Tuple CISTPL_DEVICEGEO=1E Hex is the Device Geometry Tuple. The Device Geometry Tuple is conceptually similar to a DOS disk geometry tuple CISTPL_GEOMETRY, except that tuple CISTPL_DEVICEGEO is not a format-dependent property. Tuple CISTPL_DEVICEGEO relates to the fixed architecture of the memory devices.

The fields of the Device Geometry Tuple are defined as follows:
(1) DGTPL_BUS equals n. The system bus width equals $2^{(n-1)}$. For one embodiment, "n" equals two.
(2) DGTPL_EBS equals n. The physical memory segments of the memory array have a minimum erase block size of $2^{(n-1)}$ address increments of DGTPL BUS-wide accesses.
(3) DGTPL_RBS equals n. The physical memory segments of the memory array have a minimum read block size of $2^{(n-1)}$ address increments of DGTPL BUS-wide accesses.
(4) DGTPL_WBS equals n. The physical memory segments of the memory array have a minimum read block size of $2^{(n-1)}$ address increments of DGTPL BUS-wide accesses.
(5) DGTPL_PART equals n. The physical memory segments of the memory array can have partitions subdividing the arrays in minimum granularity of $2^{(p-1)}$ number of erase blocks.
(6) FL_DEVICE INTERLEAVE equals q. Flash memory card architectures employ a multiple of $2^{(q-1)}$ times interleaving of the entire memory arrays with the above characteristics. Non-interleaved flash memory cards have values of q=1.

The tuple CISTPL_JEDEC=18 Hex is the JEDEC Programming Information tuple. The JEDEC Programming Information tuple contains the manufacturer identifier and a device identification number.

The tuple CISTPL_VER1=15 Hex is the Level One Version/Product Information Tuple. The Level One Version/Product Information Tuple contains level one compliance and card manufacturer information.

The fields of the Level One Version/Product Information Tuple are as follows:
(1) TPLLV1_MAJOR. The major version number is 04 Hex.
(2) TPLLV1_MINOR. The minor version number is 01 Hex.
(3) TPLLV1_INFO contains the name of the manufacturer, the product name, the card type, the speed, the register base, the test codes, and the copyright notice.

The tuple CISTPL_CONF=1AH is the Configurable Card Tuple. The Configurable Card Tuple describes the interface supported by flash card and the locations of Card Configuration Registers and a Card Configuration Table.

The fields of the Configurable Card Tuple are described as follows:
(1) TPCC_SZ. The size of the fields byte is 01 Hex.
(2) TPCC_LAST. The index number of the last entry in the Card Configuration Table is 00 Hex.
(3) TPCC_RADR. The Configuration Registers Base Address in the attribute memory plane is 4000 Hex.
(4) TPCC_RMSK. The configuration Registers Present Mask equals 03 Hex.

For one alternative embodiment of the present invention, the last tuple in hardware card information structure 240 points to a software attribute block in common memory plane 145.

FIG. 26 illustrates the architecture 360 of flash memory card 110. Common memory plane 145 is comprised of flash EPROMs 80-99. The memory array of each flash EPROM is in turn subdivided into blocks. For example, flash EPROM 80 includes blocks 0, 1, etc., through block J. Likewise, flash EPROMs 81 through 99 each also include blocks 0 through J.

Architecture 360 also includes attribute memory plane 210, which is also referred to as register memory plane 210. Attribute memory plane 21 0 is entered by setting the REG# input to a logical zero state. Attribute memory plane 210 includes the hardwired card information structure ("CIS") register 240 and the card control registers 111. Card control registers 111 are also referred to as control ports 111.

For one alternative embodiment, CIS register 240 includes a tuple that includes a pointer that points to card information structure 1032 stored in block zero of flash EPROM 80. In one alternative embodiment of the present invention, the card information structure (i.e., attribute information) 1032 is stored in a portion of block zero does and not take up the entire block zero. In one alternative embodiment of the present invention, CIS area 1032 is less than one kilobyte in size.

For alternative embodiments, CIS 1032 includes disk operating system disk information and information regarding a file system for flash memory card 110. For an alternative embodiment of the present invention, flash memory card 110 can include a flash file system sold by Microsoft Corporation of Redmond, Washington. For yet another alternative embodiment of the present invention, CIS area 1032 can store information regarding an "execute-in-place" flash memory file system.

For an alternative embodiment, hardwired card information structure 240 stores a data structure for a bootable disk drive ROM image that allows the host operating system (for example, MS DOS sold by Microsoft Corporation) to bootstrap the host system hardware from the memory card even if the flash memory card main memory (consisting of flash EPROMs 80-99) does not use the data format that the operating system expects at boot time.

For another alternative embodiment, hardwired card information structure 240 stores code for file system drivers unique to the nonvolatile memory technology of flash memory card 110. This would allow host computer 101 to read or Write data with respect to common memory plane 145 even if host computer 101 lacks built in drivers for the specific memory technology or file structure of flash memory card 110.

For one embodiment of the present invention, CIS 1032 is write protected by setting the ATRWP bit of write protection register 459. The portion of block zero above area 1032 is write protected by setting the CMWP bit of write protection register 457.

For one embodiment of the present invention, one of the tuples stored within CIS portion 1032 has information as to where the card information structure ends within block zero.

FIG. 27 illustrates an alternative architecture 1160 for flash memory card 110. Architecture 1160 includes common memory plane 1361 comprised of twenty flash EPROMs 1170 through 1189. Each flash EPROM is further subdivided into blocks of memory residing within the flash EPROM.

Architecture 1160 also includes a attribute memory plane 1310, which is also referred to as register memory plane 1 310. Attribute memory plane 1310 includes control registers 1162 (also referred to as control ports 1162) and memory block 1164, Attribute memory plane 1310 is entered by setting the REG# pin 61 to a logical zero state. This allows host computer 101 to read or write with respect to attribute memory plane 1310.

Memory block 1164 includes card information structure information stored in portion 1165 and extra register space found in portion 1166.

Card information structure is also found in portion 1265 of flash EPROM 1189. Portion 1265 storing the card information structure is part of block J of flash EPROM 1189. The rest of block J of flash EPROM 1189 above the card information structure portion 1265 contains other information not related to card information structure.

Thus, for architecture 1160, the card information structure for flash memory card 110 is contained in both attribute memory plane 1310 and common memory plane 1361. In other words, the card information structure appears in both portion 1165 of memory block 1164 and in portion 1265 of block J of flash EPROM 1189. The card information structure in block 1164 is protected by one write protect system and the card information structure stored in portion 1265 is protected by another write protection mechanism.

For architecture 1160, the information stored in portions 1165 and 1265 includes the name of the manufacturer of the flash memory card, a designation of the type of flash memory card 110, and size of the flash memory card 110.

For an alternative embodiment, the card information structure stored in portions 1165 and 1265 includes information regarding the disk operating system for the flash file system and the type of flash file system used. For example, the flash file system can be a Microsoft Corporation flash file system or an "execute-in-place" flash file system.

The card information structure stored in portion 1165 of block 1164 includes a pointer that points to the card information structure stored at portion 1265 of block J of flash EPROM 1189. When host computer 101 runs out of a set of tuples in location 1165, host computer 101 turns to the card information structure stored in portion 1265 of flash EPROM 1189.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A flash memory card, comprising:
 (A) a plurality of flash memories, each having
  (1) an enable control input for selecting an active mode for the respective one of the plurality of flash memories upon receipt of a first signal and a standby mode for the respective one of the plurality of flash memories upon receipt of a second signal;
  (2) a power control input for selecting a power down mode for the respective one of the plurality of flash memories upon receipt of a third signal, wherein the power down mode overrides the active mode and the standby mode;
 (B) first addressable circuitry coupled to receive first data for causing all of the plurality of flash memories to operate in the active mode concurrently by generating the first signal and by causing the first signal to be concurrently applied to the enable control input of each of the plurality of flash memories upon receipt of the first data;

(C) second addressable circuitry coupled to receive second data for causing all of the plurality of flash memories to be placed in the power down mode concurrently by generating the third signal and by causing the third signal to be concurrently applied to the power control input of each of the plurality of flash memories upon receipt of the second data regardless of the first data received by the first addressable circuitry.

2. The flash memory card of claim 1, further comprising (i) addressable power control circuitry for storing a first datum and a second datum, wherein the plurality of flash memories includes a first flash memory and a second flash memory;

(ii) circuitry for (1) reading the first datum, and (2) applying the third signal to the power control input of the first flash memory if the first datum is in a first state, which places only the first flash memory in the power down mode, and (3) not applying the third signal to the power control input of the first flash memory if the first datum is in a second state, which permits the first flash memory to enter the active mode upon receipt of the first signal and the standby mode upon receipt of the second signal;

(iii) circuitry for (1) reading the second datum, and (2) applying the third signal to the power control input of the second flash memory if the second datum is in the first state, which places only the second flash memory in the power down mode, and (3) not applying the third signal to the power control input of the second flash memory if the second datum is in the second state, which permits the second flash memory to enter the active mode upon receipt of the first signal and the standby mode upon receipt of the second signal;

(iv) circuitry for altering the first and second data of the power control circuitry based upon a first address and third data supplied to the flash memory card.

3. The flash memory card of claim 2, further comprising circuitry for preserving the first and second data from a time before the first and second flash memories enter the power down mode until a time after the first and second flash memories leave the power down mode.

* * * * *